US006810062B2

(12) United States Patent
Kuznetsov

(10) Patent No.: US 6,810,062 B2
(45) Date of Patent: Oct. 26, 2004

(54) PASSIVE OPTICAL RESONATOR WITH MIRROR STRUCTURE SUPPRESSING HIGHER ORDER TRANSVERSE SPATIAL MODES

(75) Inventor: Mark E. Kuznetsov, Lexington, MA (US)

(73) Assignee: Axsun Technologies, Inc., Billerica, MA (US)

(*) Notice: Subject to any disclaimer, the term of this patent is extended or adjusted under 35 U.S.C. 154(b) by 0 days.

(21) Appl. No.: 09/833,139

(22) Filed: Apr. 11, 2001

(65) Prior Publication Data

US 2002/0196548 A1 Dec. 26, 2002

(51) Int. Cl.$^7$ .............................. H01S 3/08; G02B 27/00
(52) U.S. Cl. ........................................ 372/92; 359/528
(58) Field of Search .............................. 372/92, 11, 45; 356/519; 359/39; 307/3

(56) References Cited

U.S. PATENT DOCUMENTS

| | | | | |
|---|---|---|---|---|
| 3,825,856 A | * | 7/1974 | Pezot .......................... 359/739 |
| 4,126,381 A | | 11/1978 | Chodzko et al. ............ 350/294 |
| 4,627,732 A | | 12/1986 | Braun et al. ................. 356/350 |
| 5,418,641 A | * | 5/1995 | Hendow et al. ............ 359/346 |
| 5,506,858 A | | 4/1996 | Takenaka et al. ............. 372/92 |
| 5,608,745 A | | 3/1997 | Hall et al. ..................... 372/26 |
| 5,963,578 A | | 10/1999 | Fulbert et al. .............. 372/101 |
| 6,134,259 A | * | 10/2000 | Danziger et al. .............. 307/3 |
| 6,178,035 B1 | * | 1/2001 | Eda et al. .................... 359/326 |
| 6,185,241 B1 | | 2/2001 | Sun ............................. 372/96 |
| 6,377,386 B1 | * | 4/2002 | Korn ........................... 356/519 |
| 6,393,035 B1 | * | 5/2002 | Weingarten et al. .......... 372/11 |
| 2002/0048301 A1 | * | 4/2002 | Wang et al. .................. 372/45 |

FOREIGN PATENT DOCUMENTS

| | | | |
|---|---|---|---|
| EP | 0 898 347 A1 | 2/1999 | ............. H01S/3/19 |
| WO | WO 92/01322 | 1/1992 | ............. H01S/3/08 |
| WO | 01/01090 A1 | 1/2001 | ............. G01H/9/00 |

OTHER PUBLICATIONS

Matinaga, F.M., et al., "Low–Threshold Operation of Hemispherical Microcavity Single–Quantum–Well Lasers at 4K", Appl. Phys. Lett. 62(5), Feb. 1, 1993, pp. 443–445.

Wilson, G.C., et al., "High Single–Mode Output Power from Compact External Microcavity Surface–Emitting Laser Diode", Appl. Phys. Lett. 63(24), Dec. 13, 1993, pp. 3265–3267.

Ferguson, Thomas R., "Optical Resonators with Nonuniform Magnification", vol. 1, No. 6/Jun. 1984/J. Opt. Soc. Am. A, pp. 653–662.

Zang, E.J., "Theory of Waveguide Laser Resonators with Small Curvature Mirrors", IEEE Journal of Quantum Electronics, vol. 33, No. 6, Jun. 1997, pp. 955–958.

* cited by examiner

Primary Examiner—Don Wong
Assistant Examiner—Hung Tran Vy
(74) Attorney, Agent, or Firm—J. Grant Houston

(57) ABSTRACT

An optical resonator is designed to suppress higher order transverse spatial modes. Higher order transverse modes in the inventive optical resonator are forced to be unstable, and ultimately achieving single transverse mode resonator operation. Specifically, the mirror shape or intracavity lens profile is tailored to bound the lower order modes while rendering the higher order modes unstable. This has application in MEMS/MOEMS devices by reducing side mode suppression ratio (SMSR) dependence on alignment tolerances, for example.

12 Claims, 25 Drawing Sheets

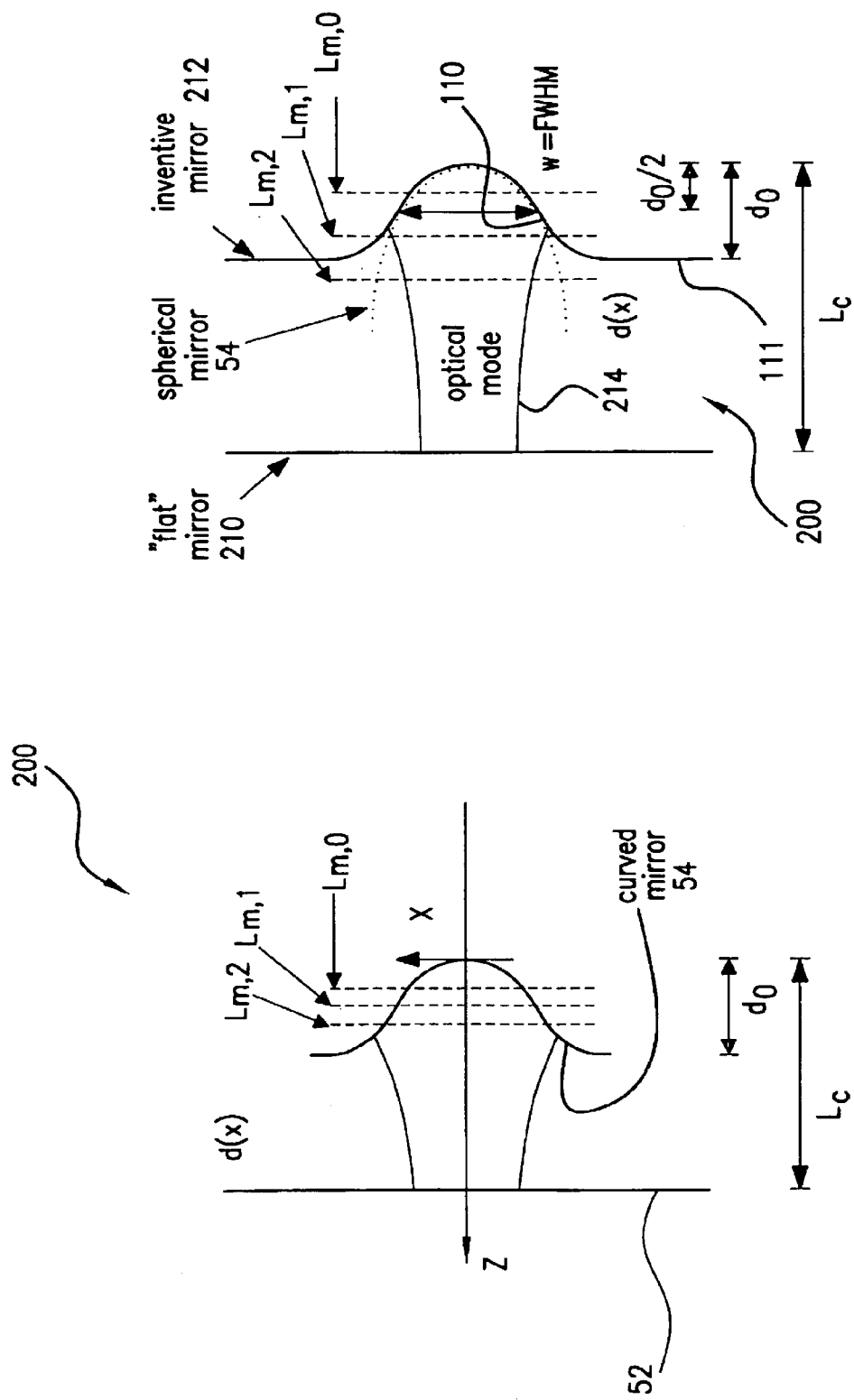

PASSIVE OPTICAL RESONATOR WITH MIRROR STRUCTURE SUPPRESSING HIGHER ORDER TRANSVERSE SPATIAL MODES

BACKGROUND OF THE INVENTION

Optical resonators include two or more mirror structures that define the resonator cavity. Optical resonators can be passive cavity devices as used, for example, in tunable Fabry-Perot (FP) filters. Active cavity devices also include a gain medium, such as a semiconductor or a solid-state material, inside the cavity between the mirror structures. The most common example of an active cavity optical resonator is the laser.

A reoccurring issue in optical resonator design, both in macroscopic and micro optical systems, is transverse spatial mode control. At scales associated with micro optical systems, which include single mode optical fiber, semiconductor gain media, and/or micro-optoelectromechanical system (MOEMS) devices, spatial mode control can dictate many system design variables.

Typically, fundamental transverse mode operation is desired in laser devices because of the optical beam spatial profile requirements for long distance beam propagation, focusing of beams into small spots, and beam coupling into single mode transmission fibers. In addition, different spatial modes of an optical resonator typically have different resonant optical frequencies, which characteristic is detrimental for active and passive cavity applications requiring spectral purity. A typical application requiring spectral purity of the resonator operation is optical spectral monitoring using tunable Fabry-Perot filters of optical signals such as wavelength-division-multiplexed (WDM) optical communication signals.

In active cavity devices, such as edge-emitting semiconductor lasers, the transverse spatial mode problem is addressed by the judicious design of the laser waveguide to ensure that it supports only a single transverse mode. In vertical cavity surface emitting lasers (VCSEL's), oxide confining layers and other aperturing techniques are used to achieve single transverse mode operation in small aperture devices. Problems begin to arise as higher output power devices are designed, however. There is contention between the desire to increase modal volume and beam diameter while at the same time suppressing oscillation of the higher-order transverse modes.

In passive cavity devices, the transverse mode problems can be more intractable, since the design degree of freedom associated with the gain medium is not present. One solution is to incorporate single mode fiber into the design. The inclusion of fiber, however, tends to complicate increased device integration, creates fiber-coupling requirements, and does not resolve all of the spatial mode problems. For example, a detector can be responsive to the input TEM20 mode even with spatial mode filtering offered by a single mode fiber; this is due to the substantial amount of power propagating in the leaky and cladding modes of the fiber.

A related solution to controlling the transverse side mode suppression ratio (SMSR) contemplates the use of intracavity apertures or spatial filters. Higher order spatial modes generally have larger mode field diameters than the fundamental TEM00 mode. As a result, apertures in the optical train can induce loss for higher order transverse modes and may be used to improve the side mode suppression. These spatial filters, however, can introduce some loss to the fundamental mode as well as to the higher order modes; they also require precise alignment.

Still another solution concerns cavity design. In a confocal Fabry-Perot cavity, where cavity length is equal to the mirror radius of curvature, all transverse modes are degenerate, i.e., all the transverse modes coexist on the same frequencies, or wavelengths, as the longitudinal mode frequencies or the longitudinal mode frequencies shifted by a half spectral period. MOEMS micro optical cavities typically have large free spectral ranges, or spectral periods, corresponding to small cavity lengths of only tens of micrometers, however. Therefore the confocal MOEMS micro cavity configuration would require mirrors with correspondingly small radii of curvature, i.e., tens of micrometers, which are difficult to fabricate, and have small mode sizes, which are difficult to align.

A more typical configuration for MOEMS tunable filter Fabry-Perot cavity is termed a hemispherical cavity. In such cavities, one of the reflectors is near planar and the other reflector is a spherical reflector. The advantage is reduced alignment criticalities because of the general radial homogenatiy of the flat reflector. In such configurations, spatial mode spectral degeneracy is not present and higher order transverse modes present a problem-spurious peaks are observed in the filter transmission spectrum.

These problems have led to solutions that focus on minimizing the excitation of higher order modes by precise control of how light is launched into the cavity. For example, U.S. patent application Ser. No. 09/666,194, filed on 21 Sep. 2000 by Jeffrey A. Korn, and Ser. No. 09/747,580, filed 22 Dec. 2000 by Walid A. Atia, et al., concern, in part, alignment of a tunable filter relative to the surrounding optical train. U.S. patent application Ser. No. 09/809,667, filed on 15 Mar. 2001 by Jeffrey A. Korn, concerns mode field matching between the launch light mode and the lowest order spatial mode of the filter. Such approaches minimize excitation of higher order spatial modes and thus yield systems with high side mode suppression ratios.

SUMMARY OF THE INVENTION

The present invention is directed to the design of the optical resonator cavity mirrors and/or intracavity lenses. The design intention for these mirrors/lenses is to degrade the ability of the resonator to support higher order transverse spatial modes. Higher order transverse modes are forced to be unstable in the inventive optical resonator, ultimately achieving improved transverse mode operation to single transverse mode resonator operation.

Generally, previous approaches to transverse mode control in optical resonators spatially varied only the magnitude of optical beam transmission or reflection inside the resonator in order to introduce differential loss for higher order stable transverse modes. In contrast, the present invention includes spatially varying the phase of optical beam transmission or reflection in the resonator in order to make higher order transverse modes of the resonator fundamentally unstable or unbound.

The invention can be analogized to optical fibers, which achieve single transverse mode operation by using spatially varying refractive indices, and hence spatially varying optical phase delay, to make higher order transverse modes of the fiber unbound and hence to suppress their propagation. Unfolded optical resonators are represented by discrete lens waveguides, with certain analogies to the continuously guiding waveguides, such as optical fibers. In the present invention, analogously with controlling the fiber refractive index profile, the mirror shape or lens profile is tailored to produce the desired spatial distribution of the intracavity optical phase delay, which selectively suppresses resonance of higher order transverse modes in the cavity. As a result, single transverse mode operation of optical resonators is achieved.

The path to implementing the invention is in the context of micro optical systems, which include single mode optical fiber, semiconductor gain media, and/or MOEMS devices. In such systems, the maximum beam diameters are typically less than a few millimeters. Specifically, in the present implementations, the maximum beam diameters in the system are less than 500 micrometers ($\mu$m). Small beams are consistent with the small form factors required in most optical communications applications, and also reduce the beam diameter translation requirements when coupling into and out of single mode fibers, which typically have a 5 to 10 $\mu$m mode diameter. Further, the beams as launched into the optical cavities are small, typically less than 200 $\mu$m. In current implementations, the launched beams are actually considerably smaller, less than 50 $\mu$m, or between 5 and 30 $\mu$m.

In more detail, according to one aspect, the invention features a passive optical resonator comprising at least one optical cavity defined by at least two mirror structures in which at least one of the mirror structures has a mirror profile having a diameter and sag that are selected in combination with a length of the cavity to degrade a stability of transverse modes with mode numbers 4 and greater.

Generally, in such implementations, the optical cavity length is less than about 50 micrometers, a sag of the optical surface is less than about 200 nanometers, and the full width half maximum of the mirror diameter is less than about 30 micrometers. More commonly, the optical cavity length is less than about 30 micrometers, a sag of the optical surface is less than about 150 nanometers, and the full width half maximum of the mirror diameter is less than about 20 micrometers. As described in more detail below, optical cavity lengths of less than about 20 micrometers, with optical surface sags of less than about 100 nanometers, and the full width half maximum mirror diameters of less than 15 micrometers have been produced. In these cases, the sag is an important parameter, since the relationship between the mirror sag and the effective mode deflections for the higher order transverse modes leads to the inability of the cavity to support these modes, according to one line of analysis.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 18 is a schematic view of a general curved-flat resonator illustrating the relationship between the curved mirror structure profile, including mirror diameter and depth, and the resonator mode profiles and mode effective length of some exemplary modes;

FIG. 19 is a schematic view of a curved-flat resonator, contrasting operation of the conventional spherical curved mirror with a multitude of transverse modes and the inventive finite-depth mirror with a only a few stable transverse modes;

DETAILED DESCRIPTION OF THE PREFERRED EMBODIMENTS

Transverse Mode Structure for Conventional Hemispherical (Spherical/Parabolic Mirror) Resonator To understand the present invention, it is helpful to understand the transverse mode structure for a conventional hemispherical resonator. A hemispherical resonator is a two mirror resonator that is defined by a flat or relatively flat mirror and a concave mirror having a spherical/parabolic surface profile.

Figure 1:
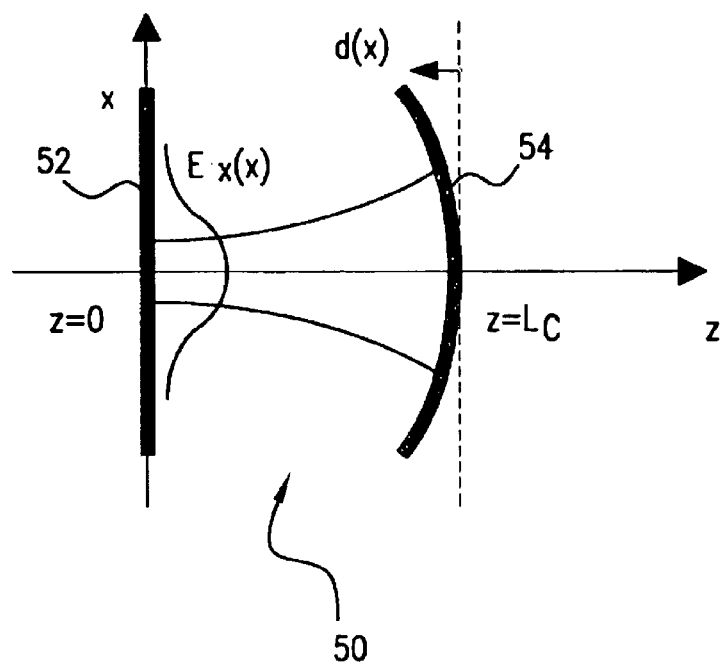
FIG. 1 is a schematic view of a conventional hemispherical resonator.
Figure 2:
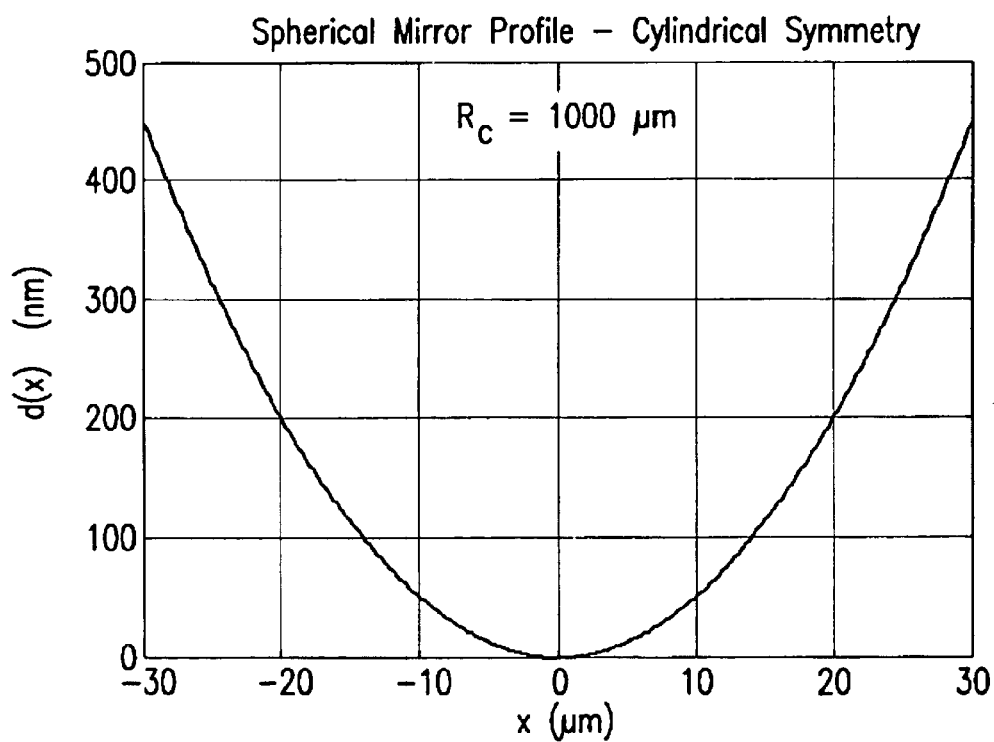
FIG. 2 is a plot of an exemplary mirror profile in nanometers (nm) as a function of radial distance in micrometers for a curved spherical mirror in the hemispherical resonator design.
Figure 3A:
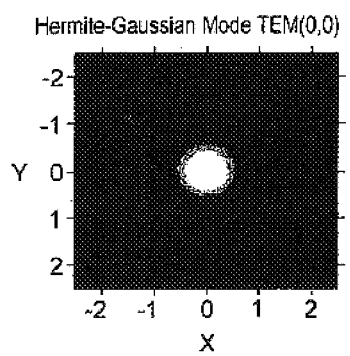
FIGS. 3A through 3F are plots in the x-y plane of the mode intensity profiles in arbitrary units for some exemplary Hermite-Gaussian transverse modes of spherical mirror resonators.
Figure 3B:
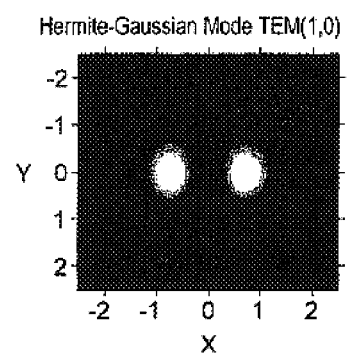
Figure 3C:
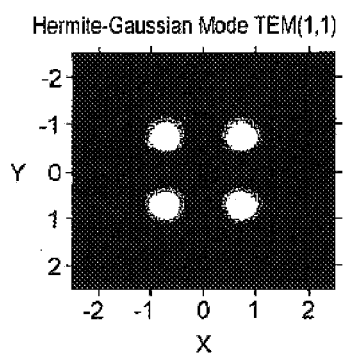
Figure 3D:
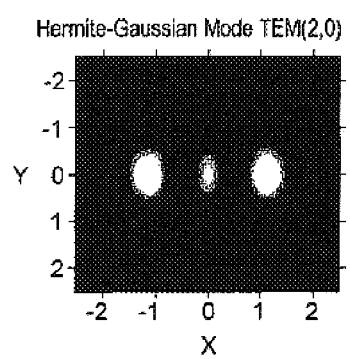
Figure 3E:
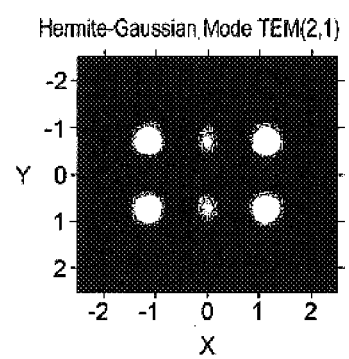
Figure 3F:
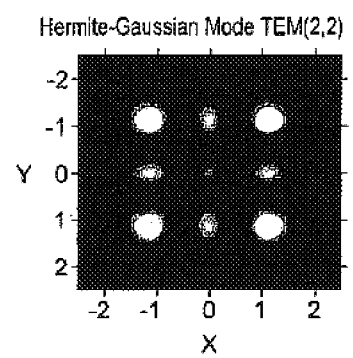

FIG. 1 illustrates such a hemispherical resonator. Optical radiation in the cavity 50 oscillates between the flat mirror 52 and the concave spherical/parabolic mirror 54. FIG. 2 is a plot of the mirror profile cross section for the curved optical surface of the mirror 54. In the present example, the radius of curvature for mirror 54 is $R_c$=1000 micrometers and the length of the cavity 50 is $L_c$=20 micrometers.

FIGS. 3A through 3F illustrate the transverse mode intensity profiles for some exemplary Hermite-Gaussian resonator modes for this defined resonator. For the lowest order mode illustrated in FIG. 3A, at the flat mirror, intensity $1/e^2$ diameter is 15.6 micrometers in the cavity 50 of the resonator defined relative to FIGS. 1 and 2. However, in addition to the lowest order mode, there are many other stable transverse modes as illustrated in FIGS. 3B through 3F for the resonator.

Figure 4:
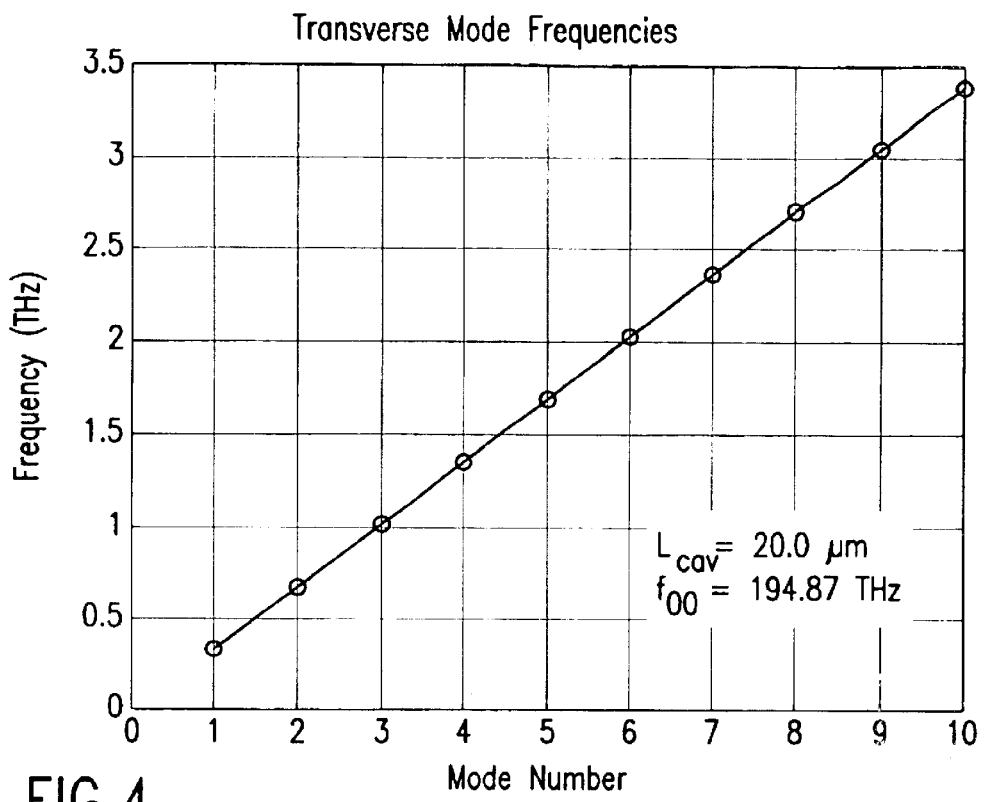
FIG. 4 is a plot of transverse mode frequencies in terahertz (THz) as a function of mode number, illustrating the modal structure of a conventional spherical resonator cavity.

FIG. 4 is a plot of the transverse mode frequencies in terahertz of the hemispherical resonator of FIG. 1. The cavity length of $L_c$=20 μm corresponds to the m=26 longitudinal mode frequency of $f_{00}$=194.87 THz. For this cavity the transverse mode spacing is 0.339 THz and the longitudinal mode spacing is 7.49 THz. Each one of the stable transverse modes of the hemispherical resonator cavity resonates at a slightly different frequency, i.e., the mode frequencies are not "degenerate" as in the confocal cavity.

Transverse Mode Structure for Resonators with Mirrors Having a Bounded Mirror Deflection One embodiment of the present invention surrounds the use of mirrors in which the mirror surface profile, including its diameter and height and profile or curvature, is tailored to produce a stable resonance for the fundamental mode, while making some or all of the higher order transverse modes of the resonator unstable.

A properly chosen mirror profile in the case of a curve-flat resonator or mirror profiles in the case of a curved-curved resonator, according to the present invention, increase the diameter of the higher order transverse modes, spreading these modes strongly outside the central region of the mirror(s), making these modes eventually unbound and unstable. In contrast, the lowest order, or fundamental, transverse mode is impacted primarily by the central region of the mirror and its behavior and stability are similar to that found in a conventional hemispherical cavity.

In one example of the inventive curved mirror, moving from the center to the edge of the mirror generally within the spatial extent of the transverse modes of interest, the mirror profile deflection is bounded to less than a certain maximum deflection or sag. This maximum in mirror deflection is achieved, for example, by varying the mirror curvature from positive near the mirror center to negative away from the mirror center. Contrast this with the conventional spherical, and also aspheric mirrors, where mirror deflection increases, at least from the perspective of many of the higher order modes, without bound. FIG. 2 illustrates the unbounded parabolic deflection of a spherical mirror. Such conventional spherical mirrors have only positive profile curvature within the range of the modes.

Figure 5:
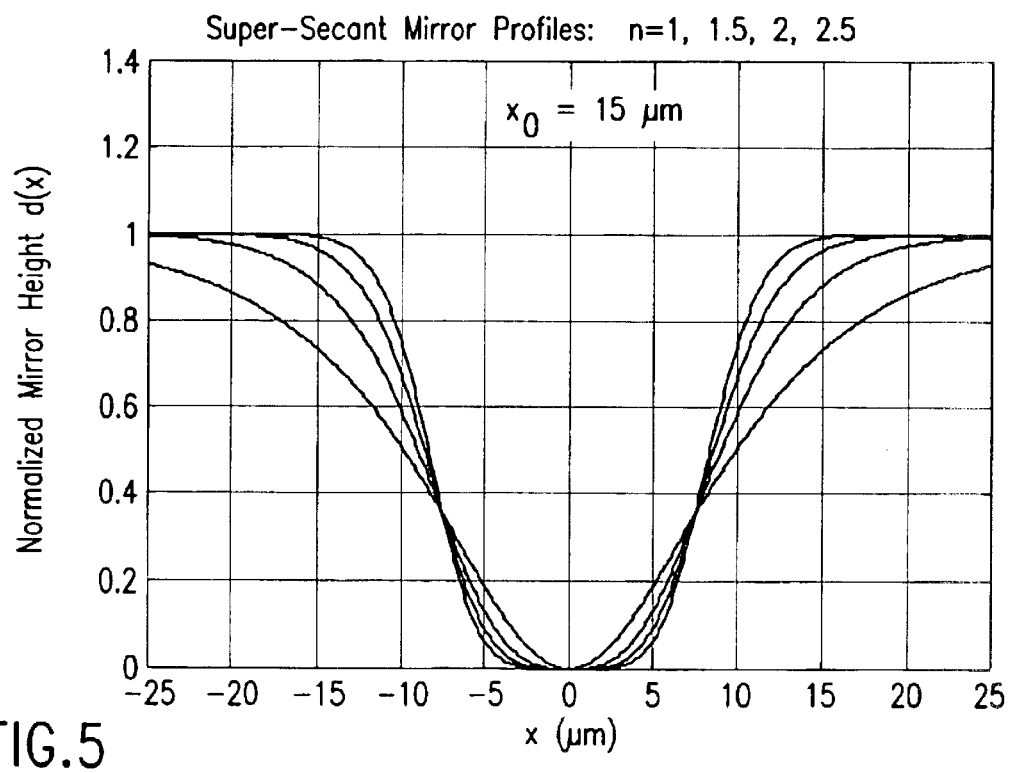
FIG. 5 is a plot of normalized mirror height as a function of radial distance for a family of super-secant hyperbolic mirror profiles, which may be used in the implementation of the present invention.

FIG. 5 illustrates some exemplary mirror profiles that have a finite maximum mirror deflection or sag; these mirrors have regions of both positive and negative curvature about the mirror center. The full two-dimensional mirror profile is generated from the cross section by making a surface of revolution, for example. The specific illustrated profiles are super-secant hyperbolic. These super-secant mirror profiles are defined by the equation $$d(x)=d_0(1-\sec h((2x/x_0)^n)).$$

Among other possible mirror profiles are super-Gaussian profiles, as well as many others.

To control the transverse modes in optical resonator cavities, a number of parameters must be selected so that the Fabry-Perot cavity will support only the lower order modes, and typically only the lowest order mode. Specifically, these parameters include the maximum mirror deflection height or sag $d_0$, the step diameter $x_0$, cavity length $L_c$, and the specific mirror profile.

Modeling the inventive cavity to illustrate the transverse mode discrimination is performed in the context of curved mirror structures with secant hyperbolic mirror profiles having diameters of $x_0$=15 micrometers and sags of $d_0$=260, 115,100, and 25 nanometers; here the mirror super-secant order is n=1. The full width at half maximum (FWHM) diameter of the mirror is $w=x_{fwhm}$=1.317$x_0$=19.8 μm. The curved mirror structures are paired with flat or relatively flat mirror structures defining Fabry-Perot (FP) cavities of length $L_c$=20 micrometers.

Modes of optical resonators with a mirror surface given by a surface of revolution are best described in cylindrical coordinates; such modes have a radial mode number $n_{radial}$ that characterizes radial variation of the mode intensity and an azimuthal mode number $n_{azim}$ that characterizes azimuthal variation of the mode intensity.

Figure 6:
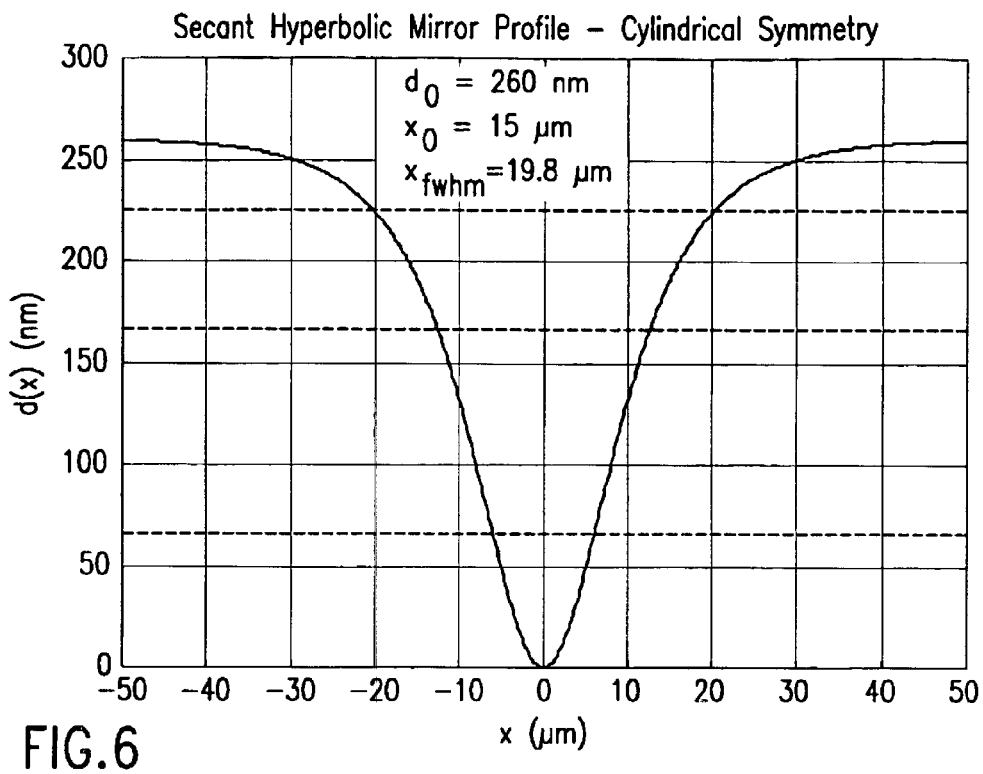
FIG. 6 is a plot of a mirror profile as a function of radial distance for an exemplary super-secant mirror having a diameter of 15 micrometers ($\mu$m) and a sag of 260 nm, also shown are effective mode lengths of the mirror in a 20 $\mu$m long cavity for the three stable transverse radial modes.

FIG. 6 shows the mirror profile cross section associated with the first modeled super-secant mirror FP cavity. The sag of the curved mirror structure is $d_0$=260 nm. The figure also shows positions of the mode effective deflections corresponding to the stable radial modes of the mirror in a 20 μm long cavity; $V_r$=4.60.

Figure 7:
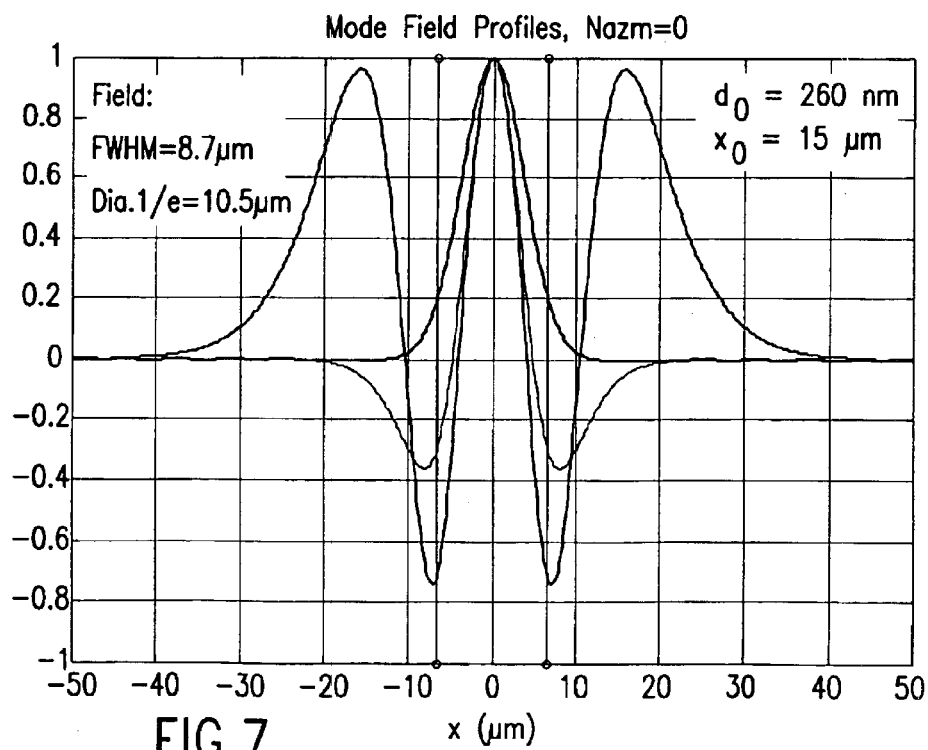
FIG. 7 is a plot of the spatial mode profiles of the three stable radial modes as a function of radial distance for a curved-flat resonator constructed with the super-secant mirror of FIG. 6 in which the cavity length is $L_c$=20 $\mu$m, mirror diameter is 15 $\mu$m, and sag is 260 nm.

FIG. 7 shows the radial field profiles of the three stable radial modes of the resonator using mirror of FIG. 6 in a 20 μm long cavity; vertical lines indicate the curvature inflection points of the secant hyperbolic mirror profile. The azimuthal mode number is zero for these modes, $n_{azim}$=0, i.e., these modes are circularly symmetric.

Figure 8:
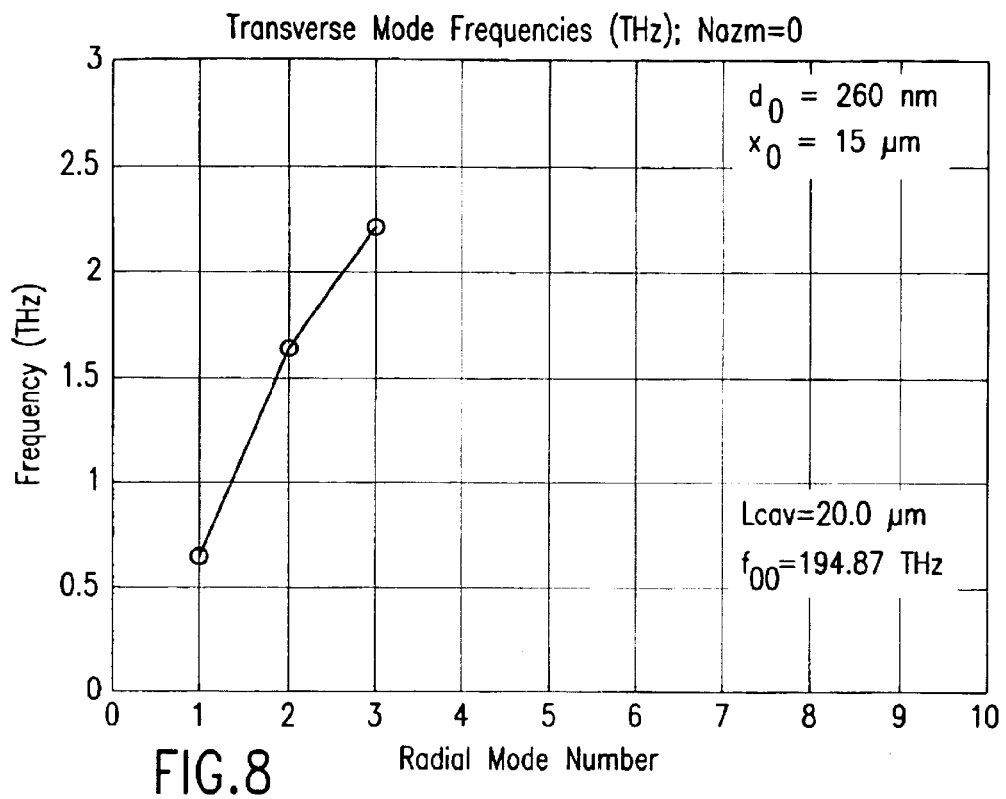
FIG. 8 is a plot of transverse mode frequencies in terahertz (THz) as a function of mode number illustrating the modal structure of a curved-flat resonator constructed with the super-secant mirror of FIG. 6 in which the cavity length is $L_c$=20 $\mu$m, mirror diameter is 15 $\mu$m, and sag is 260 nm.

FIG. 8 is a plot of the stable transverse mode frequency offset as a function of the radial mode number for a cavity with super-secant mirror of FIG. 6. This shows the result of the use of mirrors with a bounded mirror deflection, in this case the super-secant mirrors. Specifically, the resonator that implements the principles of the present invention does not support some of the higher order transverse modes, such as modes with radial mode numbers 4 and greater.

Figure 9:
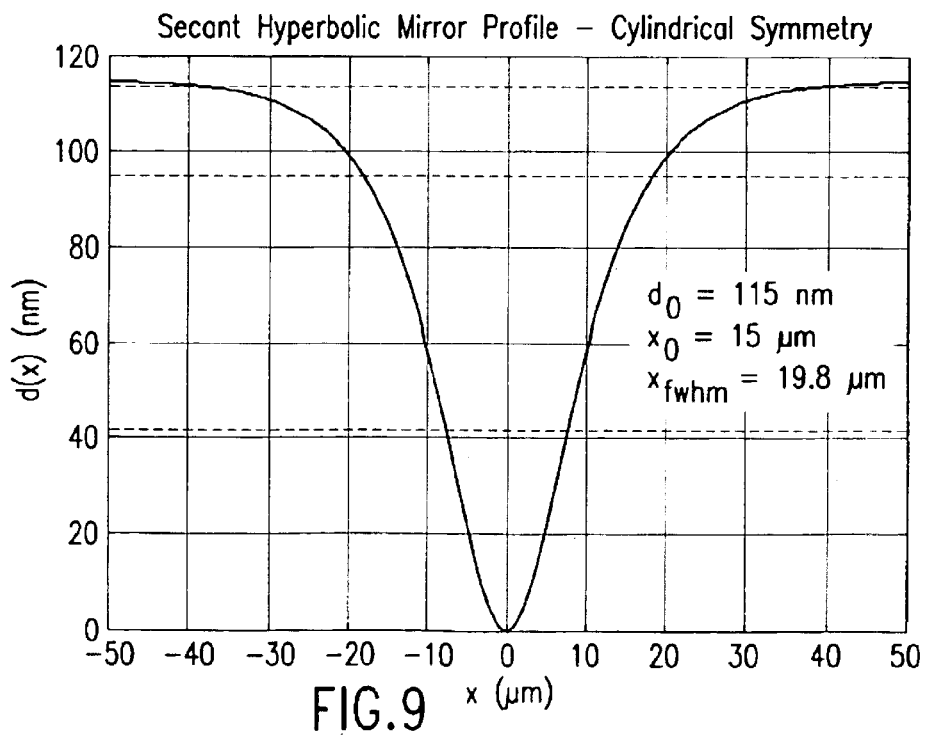
FIG. 9 is a plot of a mirror profile as a function of radial distance for an exemplary super-secant mirror having a diameter of 15 $\mu$m and a sag of 115 nm, also shown are effective mode lengths for the mirror in a 20 $\mu$m long cavity for the three stable transverse modes with the highest order mode approaching cutoff.

FIG. 9 shows the mirror profile associated with the second modeled secant hyperbolic mirror cavity; the maximum mirror deflection of sag is $d_0$=115 nm. Also shown are positions of the mode effective deflections corresponding to the stable radial modes of the mirror in a 20 μm long cavity; $V_r$=3.06. This figure illustrates the condition when a mode, in this case the third order radial mode, is approaching cutoff.

Figure 10:
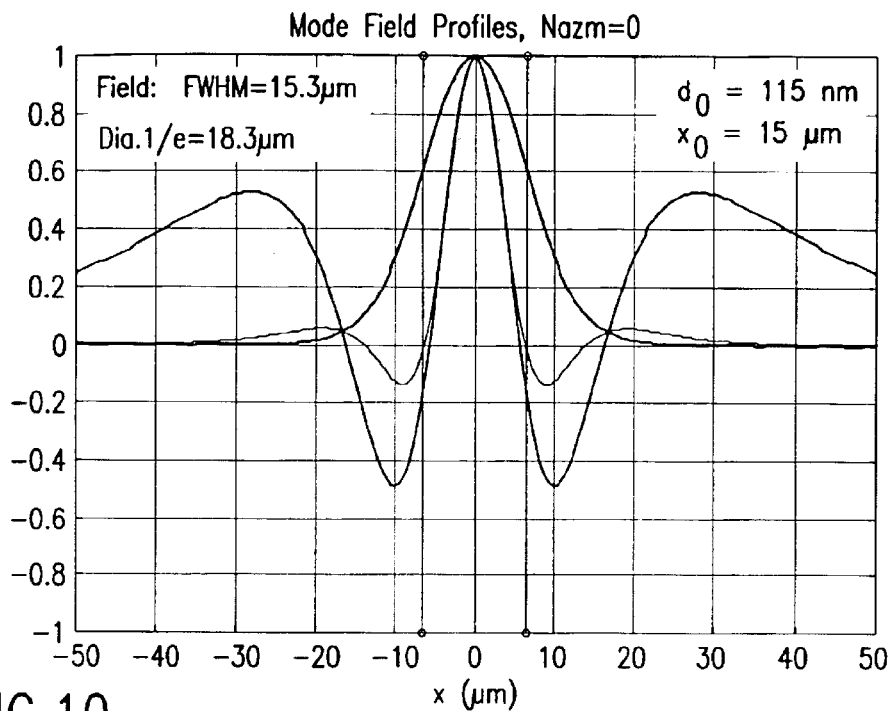
FIG. 10 is a plot of the spatial mode profiles of the three stable radial modes, with the highest order mode spatially broadened near its cutoff, as a function of radial distance for a curved-flat resonator constructed with the super-secant mirror of FIG. 9 in which the cavity length is $L_c$=20 $\mu$m, mirror diameter is 15 $\mu$m, and sag is 115 nm.

FIG. 10 shows the mode field profiles for the three stable transverse modes of the cavity using mirror of FIG. 9. Here the azimuthal mode number is zero and the vertical lines indicate the mirror curvature inflection points. The third radial mode is approaching cutoff, as evidenced by large spreading of the mode intensity beyond the mirror diameter.

Figure 11:
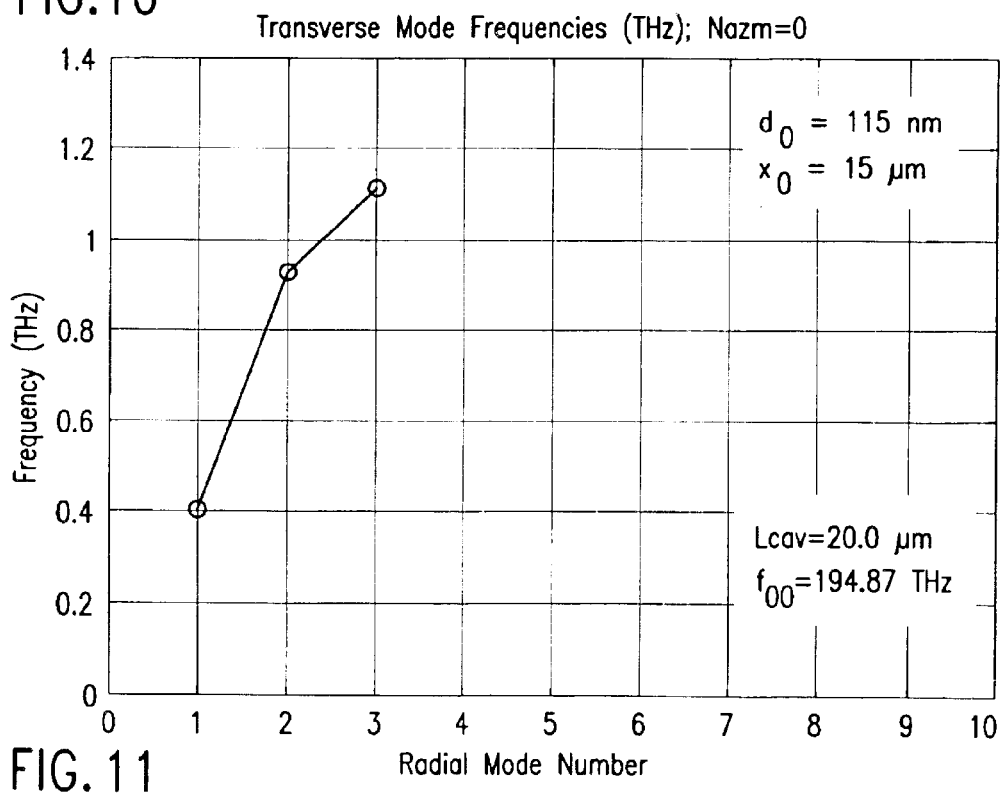
FIG. 11 is a plot of transverse mode frequencies in terahertz (THz) as a function of mode number illustrating the modal structure of a curved-flat resonator constructed with the super-secant mirror of FIG. 9 in which the cavity length is $L_c$=20 $\mu$m, mirror diameter is 15 $\mu$m, and sag is 115 nm.

FIG. 11 is a plot of the stable transverse mode frequency offset as a function of the radial mode number for the cavity using the mirror of FIG. 9. Only three lowest order radial modes are stable.

Figure 12:
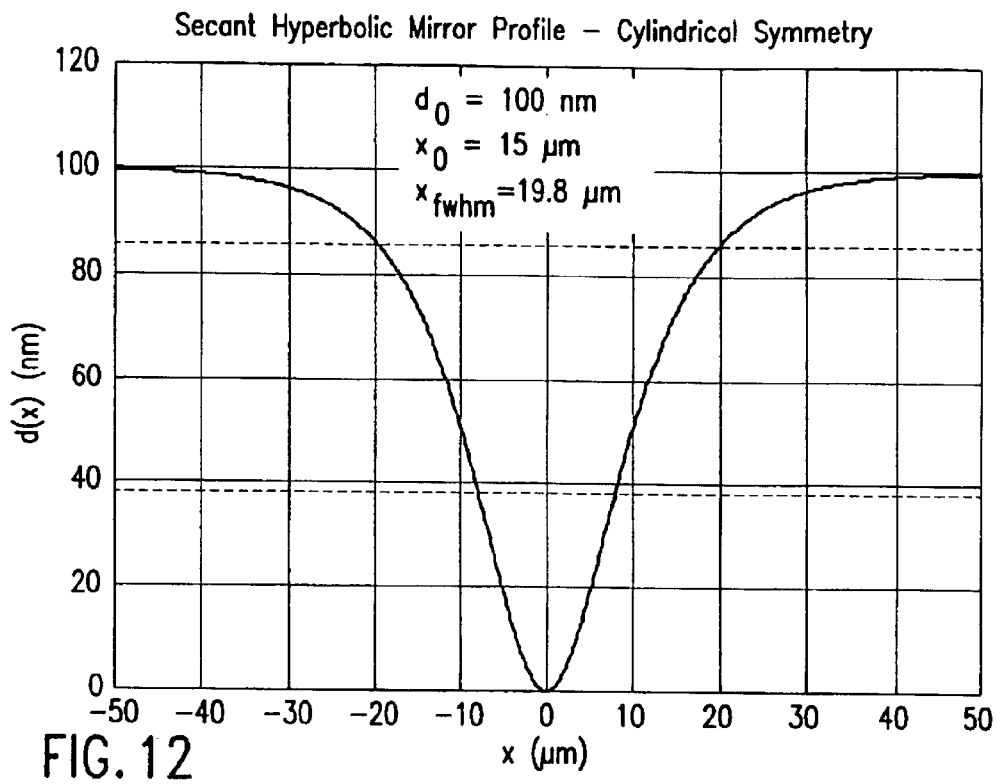
FIG. 12 is a plot of a mirror profile as a function of radial distance for an exemplary super-secant mirror having a diameter of 15 $\mu$m and a sag of 100 nm, also shown are effective mode lengths for the mirror in a 20 $\mu$m long cavity.

FIG. 12 shows a mirror profile cross section for a secant hyperbolic mirror with a further compressed sag; specifically, sag is now reduced to $d_0$=100 nanometers. FIG. 12 also shows positions of the mode effective deflections corresponding to the stable radial modes of the mirror in a 20 μm long cavity; $V_r$=2.85. For this mirror height, there are only two stable radial modes remaining.

Figure 13:
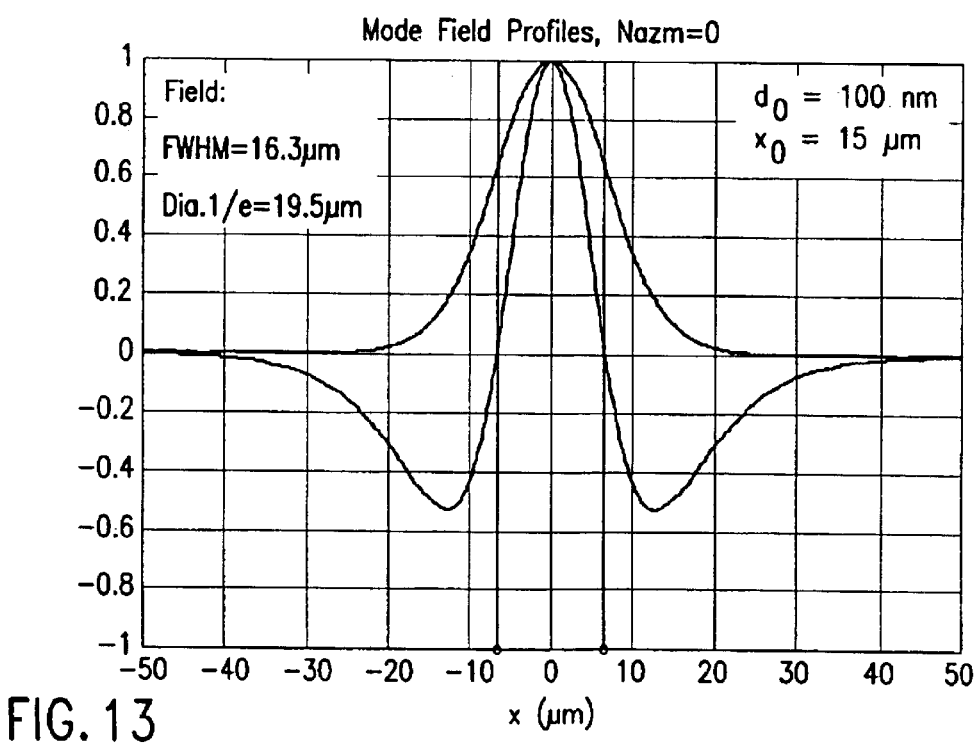
FIG. 13 is a plot of the spatial mode profiles as a function of radial distance of a curved-flat resonator constructed with the super-secant mirror of FIG. 12 in which the cavity length is $L_c$=20 $\mu$m, mirror diameter is 15 $\mu$m, and sag is 100 nm.

FIG. 13 is a plot of the mode field profiles for the mirror of FIG. 12 in a 20 μm long cavity; again, vertical lines indicate the curvature inflection points of the secant hyperbolic mirror.

Figure 14:
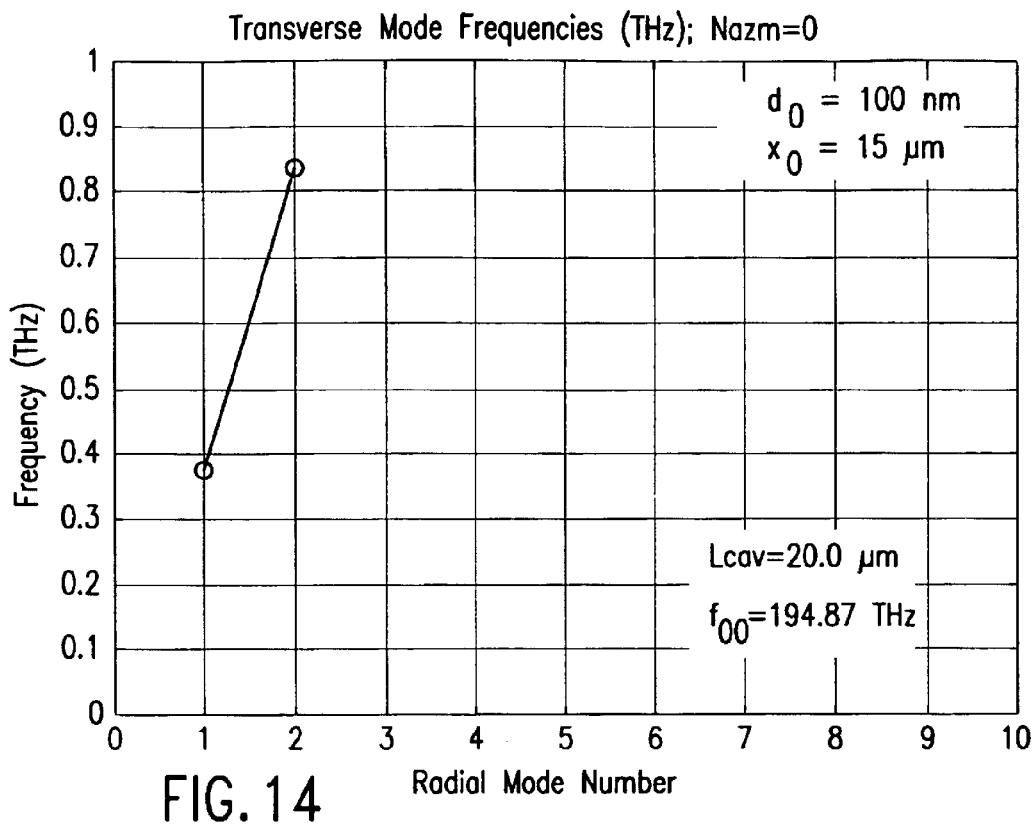
FIG. 14 is a plot of transverse mode frequencies in terahertz (THz) as a function of mode number illustrating the modal structure of a curved-flat resonator constructed with the super-secant mirror of FIG. 12 in which the cavity length is $L_c$=20 $\mu$m, mirror diameter is 15$\mu$m. and sag is 100 nm.

FIG. 14 is a plot of the stable transverse radial mode frequency offset as a function of radial mode number for the mirror of FIG. 12.

Figure 15:
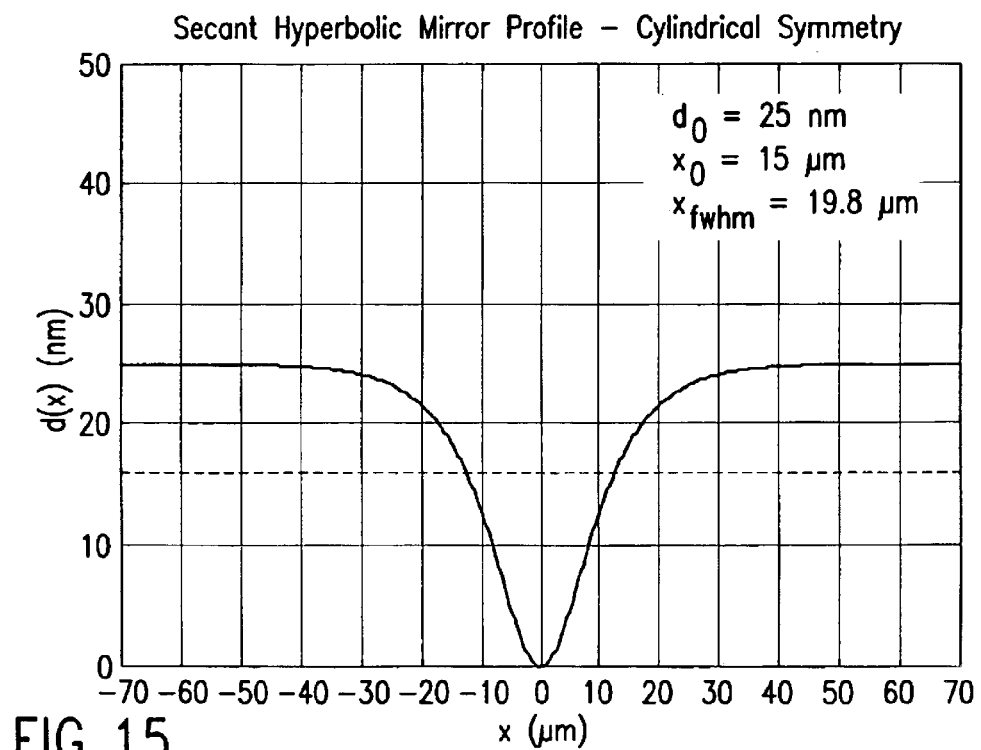
FIG. 15 is a plot of a mirror profile as a function of radial distance for an exemplary super-secant mirror having a diameter of 15 $\mu$m and a sag of 25 nm, also shown is the effective mode length for the mirror in a 20 $\mu$m long cavity for the single stable transverse mode.

FIG. 15 shows a mirror profile cross section for a secant hyperbolic mirror with a sag or maximum deflection compressed to $d_0=25$ nanometers; $V_r=1.43$. This 20 µm long cavity supports a single radial mode. Also shown is the effective deflection of the mode.

Figure 16:
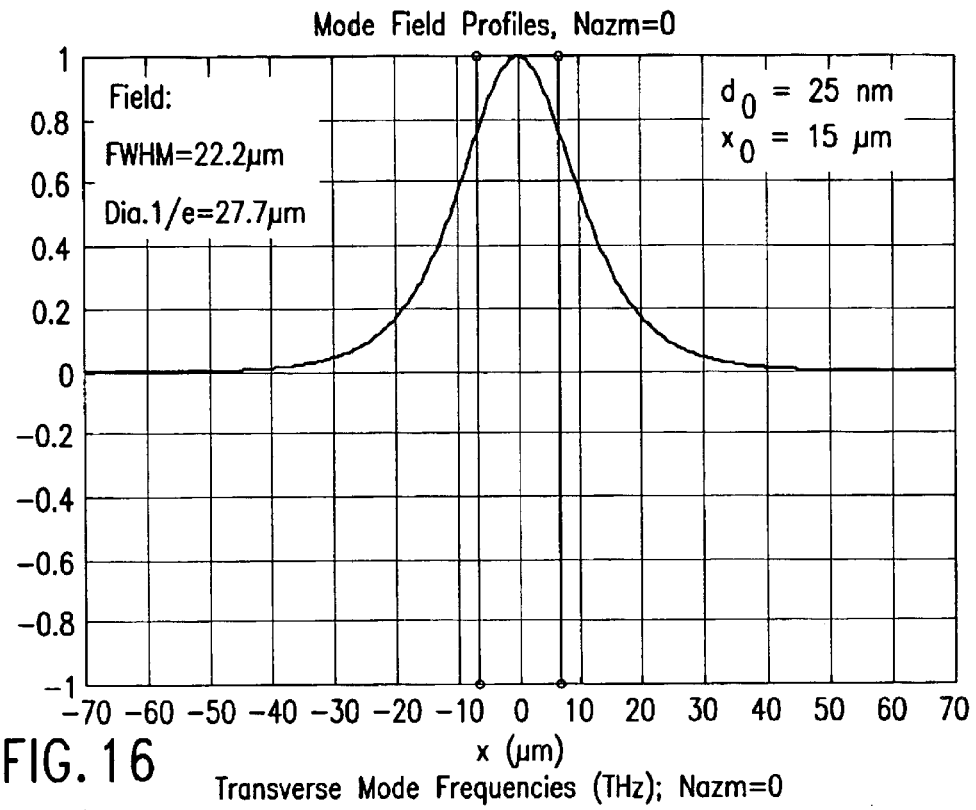
FIG. 16 is a plot of the spatial mode profile of the single stable transverse mode as a function of radial distance of a curved-flat resonator constructed with the super-secant mirror of FIG. 15 in which the cavity length is $L_c$=20 µm, mirror diameter is 15 µm, and sag is 25 nm.

FIG. 16 is a plot of the mode field profile for a cavity with the small sag mirror of FIG. 15; again, vertical lines indicate the mirror curvature inflection points. This modeling suggests that the cavity supports only a single transverse radial mode. Further modeling indicates that transverse modes with azimuthal mode number 1 are all unstable; therefore the resonator indeed supports only a single transverse mode.

Figure 17:
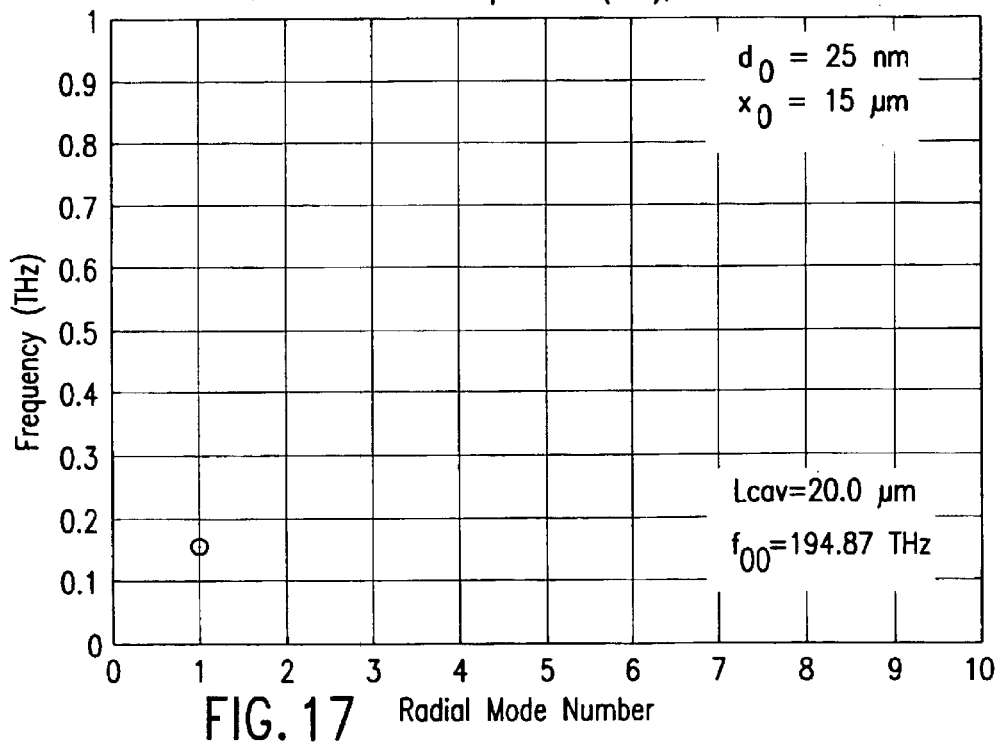
FIG. 17 is a plot of transverse mode frequencies in terahertz (THz) as a function of mode number illustrating the single modal structure of a curved-flat resonator constructed with the super-secant mirror of FIG. 15 in which the cavity length is $L_c$=20 µm, mirror diameter is 15 µm, and sag is 25 nm.

FIG. 17 is a plot of the stable transverse radial mode frequency offset as a function of radial mode number. This shows the result of the use of the secant hyperbolic mirrors with the small maximum deflection or sag. The cavity essentially supports a single transverse mode with the mode frequency shifted by 0.156 THz from the flat-flat cavity resonant frequency.

Modal Analysis of Conventional and Inventive Optical Resonator Cavities

FIG. 18 illustrates operation of a general curved-flat optical resonator configuration.

Specifically, for resonator 200, one end of the resonator is defined by a substantially or relatively flat mirror structure 52. The second mirror structure 54 has a curved profile; the spatial variation of this mirror profile deflection d(x) defines transverse modes of the resonator. Resonator cavity length $L_c$ is defined as the distance between the relatively flat mirror and the apex of the curved mirror. If the curved mirror deflection d(x) has a maximum or an upper bound, we term this maximum deflection or sag $d_0$.

Optical resonator of FIG. 18 has a set of longitudinal mode orders with longitudinal mode frequencies:

$$f_m = m\frac{c}{2\bar{n}L_c} \quad (1)$$

where m is the longitudinal mode number, c is the speed of light, and $\bar{n}$ is the refractive index of the resonator medium. Each longitudinal mode order m has a corresponding set of transverse modes with transverse mode numbers t and transverse mode frequencies $$f_{m,t} \equiv m\frac{c}{2\bar{n}L_{m,t}} = f_m + \Delta f_{m,t}. \quad (2)$$

For each transverse mode (m,t), the mode effective length is defined as:

$$L_{m,t} \equiv \frac{mc}{2\bar{n}f_{m,t}} \quad (3)$$

and the mode effective deflection $$\Delta L_{m,t} \equiv L_c - L_{m,t} \quad (4)$$

Generally, transverse mode of an optical resonator is stable only when its modal effective length falls within the effective span of the cavity lengths:

$$(L_c - d_0) < L_{m,t} < L_c \quad (5)$$

In other words, a transverse mode of an optical resonator is stable when the mode effective deflection is within the range of the mirror deflections:

$$0 < \Delta L_{m,t} < d_0 \quad (6)$$

Conversely, a transverse mode is unstable if its mode effective deflection falls outside this range. This stability condition can be also written in terms of the transverse mode frequency shifts $\Delta f_{m,t}$:

$$0 < \Delta f_{m,t} < f_m \frac{d_0}{L_c - d_0} \quad (7)$$

The stability criterion (5,6) is in analogy with optical waveguide or fiber propagation, where an optical mode is guided by the waveguide only if the mode effective index falls between the waveguide core and cladding refractive indices. When a transverse mode is stable or bound, its power is confined in the vicinity of the fiber core or the mirror diameter region, in the present situation. When a mode approaches cutoff, its power spreads far outside the fiber or mirror core, eventually making the mode unbound or unstable. For the optical fiber, mode cutoff condition corresponds to the mode effective index approaching the cladding index. For the optical resonator, the mode cutoff condition corresponds to the mode effective deflection approaching the largest deflection of the bounded deflection mirror, i.e., $\Delta L_{m,t} \approx d_0$. Generally, the mirror center corresponds to the fiber core, while the mirror edges correspond to the fiber cladding.

FIGS. 6, 9, 12, and 15 illustrate positions of the mode effective deflections of the stable transverse cavity modes within the deflection span of the bounded deflection secant hyperbolic mirrors.

For the conventional curved mirrors, such as spherical mirrors, the mirror deflection d(x) increases monotonically with distance x from the mirror apex throughout the region of x spanned by the optical modes of interest. Therefore, conventional, e.g., spherical, mirrors have no mirror deflection maximum or bound; all transverse modes are stable for resonator cavities with such unbounded deflection mirrors. In practice, maximum deflection for conventional mirrors occurs at the physical edge of the mirror; this makes unstable only the very high order transverse modes that spill beyond the edge of the mirror aperture.

For the inventive mirrors, the mirror profile deflection reaches a substantially maximum deflection $d_0$, or the deflection is bounded to less than $d_0$, within the spatial range of the transverse modes of interest, such as the fundamental transverse mode. By adjusting the mirror profile width and the maximum deflection, which is the mirror sag, we can limit the number of stable modes of the resonator. For example, the resonator can be forced to have only a single stable transverse mode.

FIG. 19 illustrates the difference between a conventional, e.g., spherical, mirror (dotted line) 54 and the inventive curved mirror 212. The inventive mirror 212 has a maximum deflection or sag $d_0$ and a diameter w defined by the mirror profile full width at half maximum (FWHM) deflection. We fit approximately a parabolic mirror 54 to the inventive mirror by passing the surface through the inventive mirror apex and the half sag points. Such parabolic/spherical mirror 54 has a radius of curvature $$R_c = \frac{w^2}{4d_0}.$$

The spherical mirror here has no maximum deflection, it supports transverse modes (m,0), (m,1), (m,2) . . . that have effective modal lengths falling within the unbounded spherical mirror deflection. The inventive mirror 212 has a maximum deflection $d_0$; here only two transverse modes (m,0) and (m,1) are stable, while the (m,2) and higher order transverse modes are unstable.

We obtain here an approximate condition for the single transverse mode operation of the inventive optical resonator. Such resonator supports only the fundamental transverse mode when the first higher order mode (m,1) becomes unstable, i.e., it violates the stability condition (6) or (7). Therefore the single transverse mode condition can be written as $$\Delta f_{m,1} = (f_{m,1} - f_m) > f_m \frac{d_0}{L_c - d_0} = \frac{c}{\lambda} \frac{d_0}{L_c - d_0} \tag{8}$$

where $\lambda = c/f_m$ is the wavelength, in vacuum, of light in the vicinity of the optical modes of interest.

The fitted spherical mirror resonator has Hermite-Gaussian transverse modes with transverse mode frequencies given by $$f_{mts} = \tag{9}$$

$$\left(m + (t+s+1)\frac{1}{\pi}\sqrt{\frac{L_c}{R_c}}\right)\frac{c}{2\bar{n}L_c} = \left(m + (t+s+1)\frac{1}{\pi}\sqrt{\frac{4L_c d_0}{w^2}}\right)\frac{c}{2\bar{n}L_c}$$

where t and s are the integer transverse mode numbers in Cartesian coordinates. For the spherical mirror, which is approximately parabolic near its apex, the transverse modes (9) are equally spaced in frequency, just as the equally spaced propagation constants in an optical waveguide with parabolically graded refractive index, or equally spaced energy levels of the harmonic oscillator with a parabolic potential.

If we assume that the first higher order mode (m,1) of the inventive resonator has its mode frequency given approximately by the fitted spherical mirror, the (m,1) mode frequency is given by (9) with (t+s)=1. Therefore $$f_{m,1} = f_{m01} = \left(m + \frac{2}{\pi}\sqrt{\frac{4L_c d_0}{w^2}}\right)\frac{c}{2\bar{n}L_c}$$

and the single mode condition (8) for optical resonators becomes approximately $$\frac{\pi w}{\lambda}\bar{n}\frac{\sqrt{d_0/L_c}}{(1-d_0/L_c)} \approx \frac{\pi w}{\lambda}\bar{n}\sqrt{d_0/L_c} < 2 \tag{10}$$

since $d_0/L_c \ll 1$. Compare this with the single mode condition for a step index fiber with the core diameter w, core and cladding indices $n_{core}$ and $n_{clad}$, and the index difference $\Delta n = (n_{core} - n_{clad})$:

$$V_f = \frac{\pi w}{\lambda}\sqrt{n_{core}^2 - n_{clad}^2} \approx \frac{\pi w}{\lambda}\sqrt{2n_{clad}\Delta n} < 2.405 \tag{11}$$

Here $V_f$ is the dimensionless V-parameter for the fiber. The two conditions for the resonators and fibers are qualitatively similar; in case of optical resonators, the role of core-cladding index difference $\Delta n$ is played by the normalized mirror deflection $d_0/L_c$.

In analogy with optical fibers, we define a dimensionless V-parameter for optical resonators:

$$V_r \equiv \frac{\pi w}{\lambda}\bar{n}\sqrt{d_0/L_c} \tag{12}$$

Furthermore, to characterize the resonator transverse modes, we define a dimensionless mode parameter $\Lambda$:

$$\Lambda \equiv 1 - \Delta L_{m,t}/d_0 \tag{13}$$

which is simply related to the ratio of the mode effective deflection $\Delta L_{m,t}$ and the mirror maximum deflection $d_0$. The $\Lambda$ parameter ranges between 0 and 1 and characterizes the strength of the mode confinement by the mirror: $\Lambda \sim 1$ corresponds to the strongly confined or strongly bound modes, $\Lambda \sim 0$ corresponds to the mode cutoff condition when the modes become unbound.

For different values of the optical resonator parameters w, $d_0$, $L_c$, and $\lambda$, we calculate the resonator V parameter and the transverse mode frequencies with the corresponding mode effective deflection and the mode $\Lambda$ parameter. A $\Lambda$-V diagram is a plot of the modal $\Lambda$ values as a function of the resonator V parameter.

Generally, in the discussions, a curved-flat optical cavity is considered, in which the curved optical surface is formed on one of the mirror structures with the other mirror structure being relatively flat, possibly only having a bow. These cavities have advantages in implementation due to the reduced assembly tolerance in the alignment of the mirror structures. The analysis can be generalized to curved-curved optical cavities, however, by introducing the concept of net optical curvature or a net mirror profile. The net mirror profile is the total round-trip profile that the optical wave sees in the cavity, as if an equivalent curved-flat cavity were being analyzed.

Figure 20:
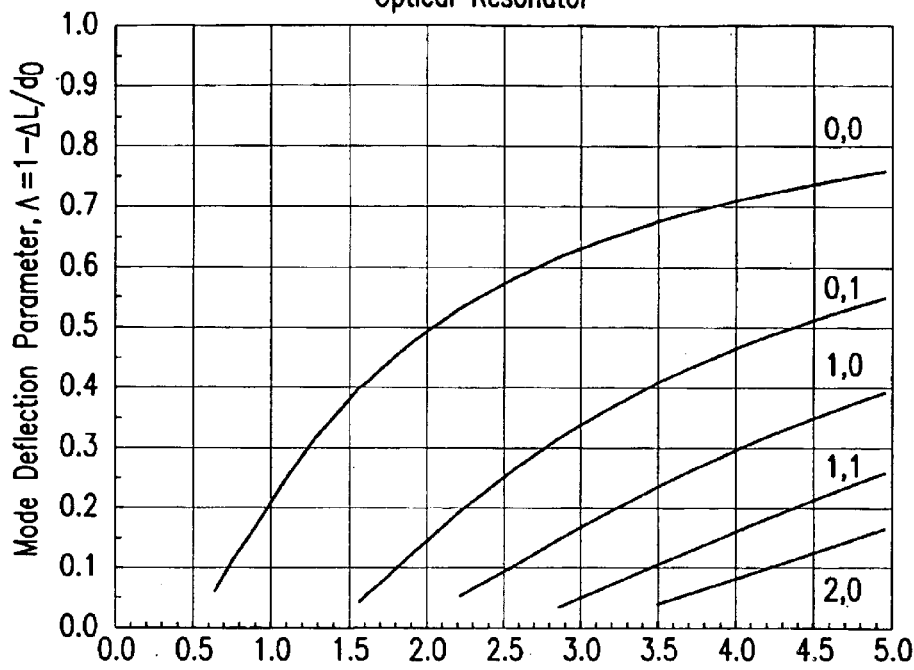
FIG. 20 is the Λ-V transverse mode stability diagram for optical resonators using mirrors with a finite deflection, specifically secant hyperbolic surface profile.

FIG. 20 shows the $\Lambda$-V diagram for optical resonators made using the secant hyperbolic profile mirrors paired with a flat mirror; the mode labels ($n_{radial}$, $n_{azim}$) correspond to the radial and azimuthal transverse mode numbers. For large cavity V numbers, $V_r > 4$, the resonator supports multiple modes: (0,0), (0,1), (1,0), (1,1), (2,0), etc. As the cavity V number decreases, the modal $\Lambda$ parameters also decrease, as the modes become more weakly bound. The higher order transverse modes reach cutoff one-by-one as their $\Lambda$ parameter decreases to zero. The (2,0) mode gets cutoff near $V \sim 3.5$ with only four remaining stable modes, the (1,1) mode near $V \sim 2.8$ with three remaining stable modes, the (1,0) near $V \sim 2.2$ with two remaining stable modes. The (0,1) first higher order mode gets cutoff near $V = V_0 \sim 1.5$. For values of the resonator V parameter less than $V_0 \sim 1.5$, the optical resonator supports only a single transverse mode, namely the fundamental mode. The fundamental mode apparently becomes cutoff and unbound for $V < 0.6$. Therefore, the resonator single mode condition is:

$$V_r < 1.5 \tag{14}$$

The approximate single mode condition we gave in (10) by comparing inventive mirrors with spherical mirrors is $V_r < 2$, which is not too far from the more accurate condition (14) above for the secant hyperbolic shaped mirrors.

Figure 21:
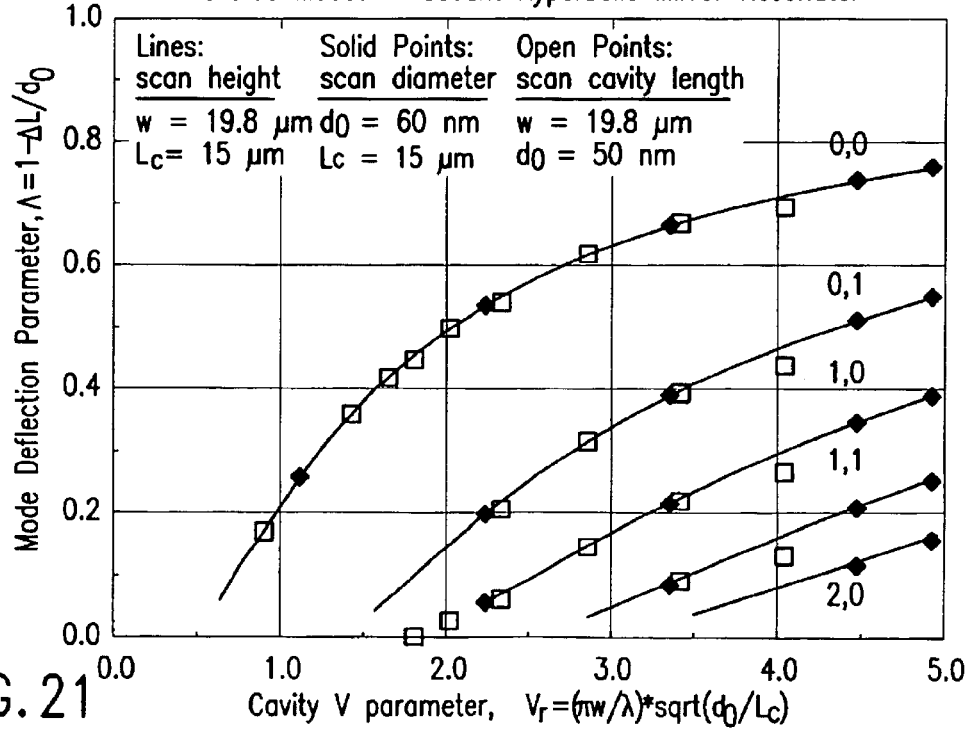
FIG. 21 is the Λ-V transverse mode stability diagram for optical resonators illustrating the universal nature of the resonator V parameter.

To confirm that the resonator $V_r$ parameter (12) is indeed a universal cavity parameter and the $\Lambda$-V diagram is a universal diagram, we plot in FIG. 21 the $\Lambda$-V plot for optical cavities with secant hyperbolic mirrors where we scan separately the mirror deflection height, the mirror diameter, and the cavity length. For all these cavities the modal $\Lambda$-V plots essentially correspond, confirming the universality of the $\Lambda$-V plot. There is only a small deviation in the plots for the cavity length scan at the larger V parameters, V>4, which is far from the single mode condition of interest. Therefore, all the different optical cavities with the same $V_r$ parameter, while having different mirror diameters, mirror deflections and cavity lengths, will have the same modal $\Lambda$ parameter.

Figure 22:
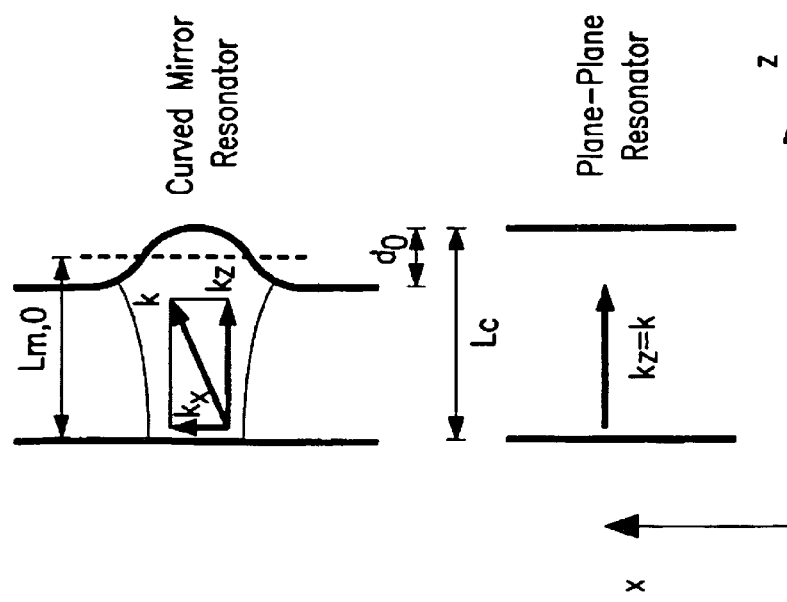
FIG. 22 illustrates modal optical k-vector propagation directions and the effective mode lengths in the plane-plane and curved mirror optical resonators, from which the fundamental mode size of these resonators is derived, as well as the behavior of the resonator unstable modes.

From the $\Lambda$ parameter of the fundamental mode we can determine the $1/e^2$ diameter $x_w$ of the mode intensity distribution. Referring to FIG. 22, for a plane-plane cavity of length $L_c$ all modes have the resonance condition $$\bar{n}k_m L_c = m\pi \quad (15)$$

where $k_m = 2\pi f_m/c = 2\pi/\lambda_m$ is the optical wavevector and $f_m$ is the longitudinal mode frequency (1). The mode effective lengths are all equal to the cavity length and the modes are transversely unbound plane waves. When one or both mirrors of the cavity become curved, the fundamental mode has a mode effective length $L_{m,t}$ that is shorter than the cavity length, $L_{m,t} < L_c$, with the resulting new resonance condition for the curved mirror cavity that follows from the effective length definition in (3):

$$\bar{n}k_{m,t} L_{m,t} = m\pi \quad (16)$$

As a result, we now have $\bar{n}k_{m,t} L_c > m\pi$ for the curved mirror resonator, i.e., the optical k-vector is too long to resonate at the cavity length. The reason is that the mode now has a finite transverse extent and contains plane wave components with k-vector tilted relative to the z axis at angle $\theta_d$. Angle $\theta_d$ gives the divergence half angle of the resonator mode. The $k_z$ component of the k-vector along the z-axis now satisfies the curved mirror cavity resonance condition:

$$\bar{n}k_z L_c = m\pi \quad (17)$$

where $k_z = k_{m,t} \cos \theta_d$. From (16) and (17) we obtain expression for the k-vector tilt angle, or the beam divergence half angle, $\theta_d$:

$$\cos\theta_d = \frac{L_{m,t}}{L_c} \text{ and } \tan\theta_d = \sqrt{\left(\frac{L_c}{L_{m,t}}\right)^2 - 1} \approx \sqrt{\frac{2\Delta L}{L_c}} \quad (18)$$

since $\Delta L \ll L_c$. Angle $\theta_d$ gives the divergence half angle of the resonator mode. From the standard Gaussian beam expressions, the modal beam waist diameter $x_w$ at $1/e^2$ intensity point is obtained directly from this divergence angle:

$$x_w = \frac{2\lambda}{\pi \tan\theta_d} \approx \frac{\lambda}{\pi}\sqrt{\frac{2L_c}{\Delta L}} \quad (19)$$

The ratio between the fundamental mode $1/e^2$ waist diameter $x_w$ and the mirror full width half max diameter $w$ becomes $$\frac{x_w}{w} = \frac{\lambda}{\pi w}\sqrt{\frac{2L_c}{\Delta L}} = \frac{1}{V}\sqrt{\frac{2d_0}{\Delta L}} = \frac{1}{V}\sqrt{\frac{2}{1-\Lambda}} \quad (20)$$

Figure 23:
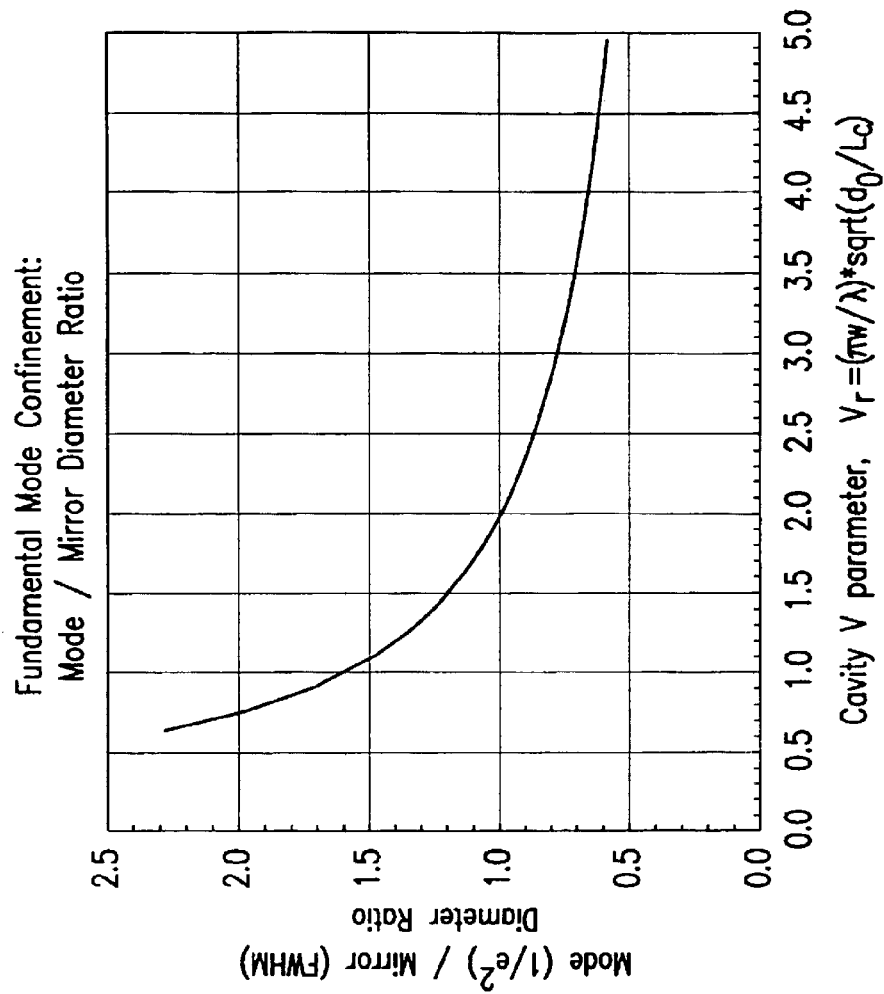
FIG. 23 shows the mode diameter to mirror diameter ratio as a function of the resonator V-parameter, as calculated for optical resonators with the secant hyperbolic profile mirrors.

FIG. 23 shows the plot, for the fundamental transverse cavity mode, of this mode to mirror diameter ratio as a function of the cavity V-parameter, as calculated for the secant hyperbolic profile mirror resonators. The mode diameter is smaller than the mirror diameter for the larger V numbers (V>3). Generally, the ratio of the mode to the mirror diameter is less than 0.7 for V numbers greater than 3. The mode diameter increases relative to the mirror diameter as the cavity V numbers get smaller, with the ratio at unity for $V_r = 2$, and for still smaller values of V the mode diameter becoming greater than the mirror diameter and finally diverging near the V~0.5 fundamental mode cutoff. For the single mode condition of V at about 1.5, the ratio is about 1.2.

We now consider in more detail the mode cutoff condition and the unstable or unbound transverse mode regime. The mode stability condition (5) can also be written as:

$$\bar{n}k_{m,t}(L_c - d_0) < \bar{n}k_{m,t} L_{m,t} < \bar{n}k_{m,t} L_c \quad (21)$$

or $$\bar{n}k_{m,t}(L_c - d_0) < m\pi < \bar{n}k_{m,t} L_c \quad (22)$$

since by definition in (16) we have $\bar{n}k_{m,t} L_{m,t} = m\pi$. We have seen that the inequality in (22) on the right, $$m\pi < \bar{n}k_{m,t} L_c \quad (23)$$

implies a confined or bound mode with a diverging beam that has k-vectors tilted from the z axis by an angle $\theta_d$, the beam divergence half angle, such that $$m\pi = \bar{n}k_{m,t} \cos \theta_d L_c \quad (24)$$

with the angle $\theta_d$ given in the stable regime by $$\cos\theta_d = \frac{L_{m,t}}{L_c} \quad (18)$$

In turn, when a mode becomes unstable, the stability inequality in (22) on the left is violated, becoming the mode instability condition:

$$\bar{n}k_{m,t}(L_c - d_0) > m\pi \quad (25)$$

This implies that in the unstable regime the mode consists of rays with k-vectors tilted from the z axis by an angle $\theta_r$, such that $$\bar{n}k_{m,t} \cos \theta_r (L_c - d_0) = m\pi \quad (26)$$

The ray angle $\theta_r$ is given in this unstable mode regime by $$\cos\theta_r = \frac{L_{m,t}}{L_c - d_0} = \frac{1 - \Delta L/L_c}{1 - d_0/L_c} = \frac{1 - (1-\Lambda)d_0/L_c}{1 - d_0/L_c} \quad (27)$$

and for $\Delta L \ll L_c$ we have $$\tan \theta_r \approx \sqrt{-2\Lambda d_0/L_c} \quad (28)$$

Note that in the unstable regime $\Delta L > d_0$ and $\Lambda < 0$.

In the unstable regime, the resonator transverse modes are rays, tilted by angle $\theta_r$ relative to the z axis, that bounce between the two cavity mirrors in the plane-plane region of the cavity outside the curved mirror diameter, or the cavity core. These rays are only slightly perturbed by the curved mirror deflection near the cavity core. These unstable ray modes of the resonator correspond to the unbound radiation modes of the optical fiber or waveguide. For a fiber, radiation modes have modal effective indices that fall below the cladding refractive index; these modes are plane wave like and are only slightly refracted by propagation through the waveguide core.

We now illustrate the spectral positions of the stable bound and unstable unbound transverse modes of optical resonators. The transverse mode wavelength can be written as $$\lambda_{m,t} = \frac{2\pi}{k_{m,t}} = \frac{2\bar{n}}{m}(L_c - \Delta L_{m,t}) = \frac{2\bar{n}}{m}L_c(1-(1-\Lambda_{m,t})d_0/L_c) \quad (29)$$

Further, for the m-th longitudinal mode we define the longitudinal mode wavelength $$\lambda_m = \frac{2\bar{n}}{m}L_c \quad (30)$$

and the mode cutoff wavelength $$\lambda_{m,c} = \frac{2\bar{n}}{m}(L_c - d_0) \quad (31)$$

We therefore obtain a simple relation between the modal wavelength $\lambda_{m,t}$ and the modal $\Lambda_{m,t}$ parameter:

$$(\lambda_{m,t} - \lambda_{m,c}) \approx \lambda_{m,c} \Lambda_{m,t}(d_0/L_c) \quad (32)$$

where we have assumed that $(d_0/L_c) \ll 1$. Thus for $\Lambda_{m,t}=0$ at mode cutoff we have $\lambda_{m,t}=\lambda_{m,c}$ and for $\Lambda_{m,t}=1$ for fully confined modes, we have $\lambda_{m,t}=\lambda_m$. Note that the mode cutoff wavelength $\lambda_{m,c}$ depends only on the mirror sag do and the cavity length $L_c$; it is independent of the mirror diameter. For bound modes, which satisfy $0 < \Delta L_{m,t} < d_0$ from (6), we then have $$\lambda_{m,c} < \lambda_{m,t} < \lambda_m \text{ or } 0 < \Lambda < 1 \quad (33)$$

For the unbound modes, which satisfy $\Delta L_{m,t} > d_0$, we have $$\lambda_{m,t} < \lambda_{m,c} \text{ or } \Lambda < 0 \quad (34)$$

Figure 24:
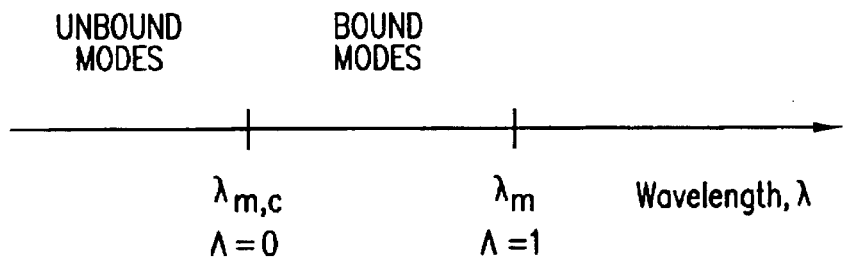
FIG. 24 shows the spectral positions of the stable bound and unstable unbound transverse cavity modes in the Fabry-Perot resonator spectrum.

FIG. 24 illustrates the positions of the bound and unbound cavity modes in the Fabry-Perot resonator spectrum. This is analogous to the spectrum of the guided and unguided modes in an optical fiber. The spectral width of the bound mode region is determined solely the mirror sag: $(\lambda_m - \lambda_{m,c}) = (2\bar{n}/m)d_0$; the spacing of the bound modes inside the bound mode region is also determined by the mirror diameter and the cavity length.

Optical resonator analysis in this section can also be applied to the conventional spherical mirror resonators. For example, expression (19) applies also to the spherical mirror resonators. For a spherical mirror the transverse mode frequencies are given by (9) and the effective mode deflections are $$\Delta L = L_c \left(\frac{t+s+1}{m}\right)\frac{1}{\pi}\sqrt{\frac{L_c}{R_c}} \quad (35)$$

for resonators with a short cavity length with $L_c \ll R_c$. From (19) we then obtain the following expression for the fundamental t=s=0 mode beam waist diameter at $1/e^2$ point:

$$x^2_{w,spherical} = \frac{4\lambda}{\pi}\sqrt{R_c L_c} \quad (36)$$

which is in agreement with conventional expressions for spherical mirror resonators. The Λ-V diagram can also be constructed and applied to the spherical mirror resonators. For a spherical mirror with an aperture diameter of $w_a$ and a radius of curvature $R_c$, the mirror sag is $d_0 = W_a^2/(8R_c)$ and the resonator V parameter becomes $$V_{spherical} = \frac{\pi w_a^2}{4\lambda\sqrt{R_c L_c}} \quad (37)$$

For a spherical micro mirror with an aperture of $w_a = 100 \mu m$ and a radius of curvature of $R_c = 1500 \mu m$, the 20 $\mu m$ long cavity at 1.55 $\mu m$ wavelength has a V parameter of $V_{spherical} = 29.3$. The Λ-V diagram of FIG. 20, which looks somewhat different for spherical rather than secant hyperbolic shaped mirrors, indicates that such a spherical mirror cavity indeed supports a multitude of transverse modes.

The single mode condition (14) for optical resonators indicates that the product of the mirror full width half max diameter w and the square root of the normalized mirror sag $d_0/L_c$ has to be sufficiently small in order to suppress higher order transverse modes.

Figure 25:
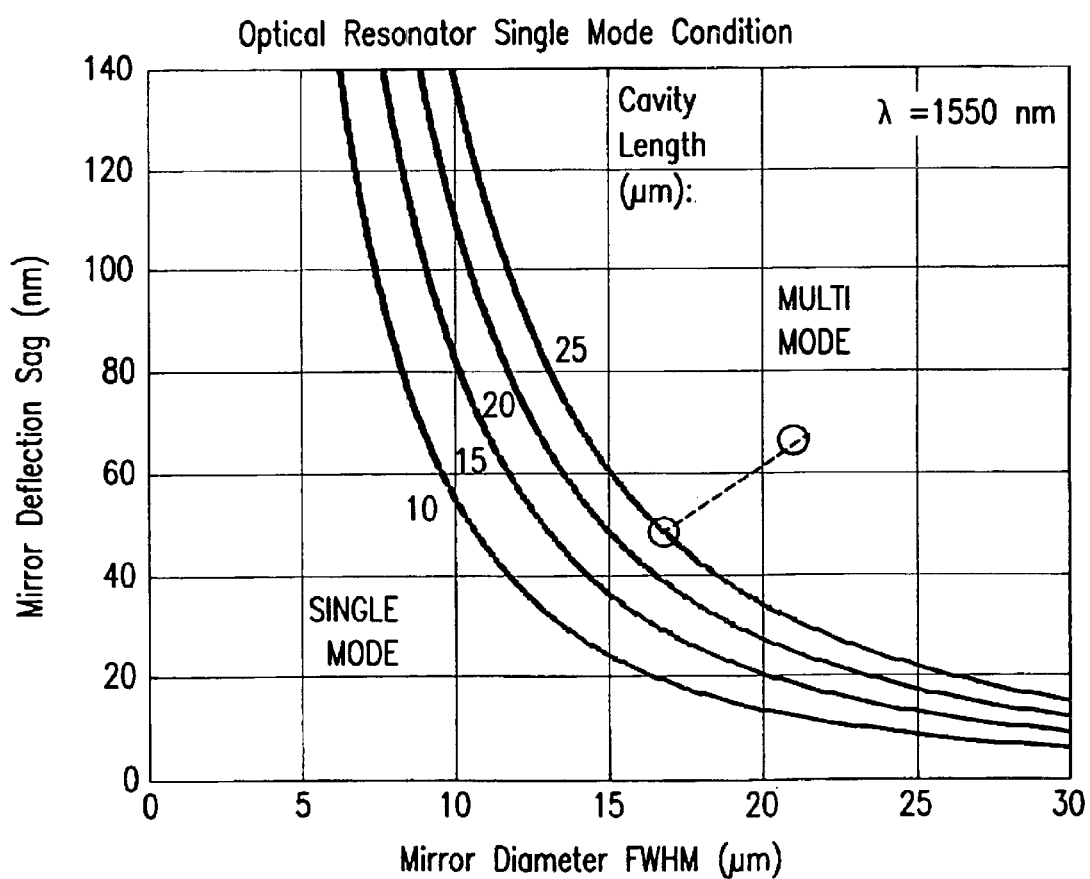
FIG. 25 shows the regimes of single mode and multi transverse mode optical resonator operation as dependent on the mirror diameter, mirror height, and the cavity length.

FIG. 25 illustrates the single mode condition (14) of the inventive optical resonators for a set of resonator parameters applicable to the tunable Fabry-Perot MOEMS filters. We plot here the maximum mirror deflection or sag $d_0$ versus the mirror FWHM diameter that allows the single transverse mode operation; the plot is repeated for several values of the cavity length $L_c$. For each cavity length, the region below the corresponding curve gives single-mode operation, while in the region above this curve first one and then more higher-order modes become stable. Note the small required mirror diameters, 5 to 30 micrometers, and mirror sags, 20 to 120 nanometers, for the cavity lengths of 10 to 25 micrometers.

FIGS. 6, 9, 12 and 15 show the secant hyperbolic mirror profiles together with the calculated effective deflection positions of the stable transverse modes. As the secant hyperbolic mirror height is reduced from 260 to 25 nm for the fixed mirror diameter of $x_0 = 15 \mu m$ (w=$x_{fwhm} = 19.8 \mu m$), fewer transverse modes fit their effective deflections within the mirror deflection range, eventually only a single fundamental transverse mode remains within the range and is the only stable mode. For the mirror FWHM diameter of 20 $\mu m$, the single mode condition in FIG. 25 predicts transition from multi mode to single transverse mode operation at the mirror height of about 30 nm, in agreement with secant hyperbolic mirror resonator calculations in FIGS. 6–17.

We have described the use of controlled profile curved mirrors in order to control the transverse modes of the optical resonator. One can accomplish the same goal by using an intracavity lens or a graded index lens to provide the required optical phase profile distribution inside an optical resonator.

Experimental Results: Optical Resonators with Finite Deflection Mirrors

In order to test the operation of the inventive finite deflection mirrors in Fabry-Perot resonators, we have fabricated arrays of such micro mirrors on semiconductor substrates using photolithographic techniques. The mirrors were formed by etching cylindrical blind holes, or inverted mesas, into silicon, Si, and gallium phosphide, GaP, substrates and then executing a mass transport process in order to smooth out the contour. This yields a mirror profile of a given diameter and depth that has both negative and positive curvature regions.

Figure 26:
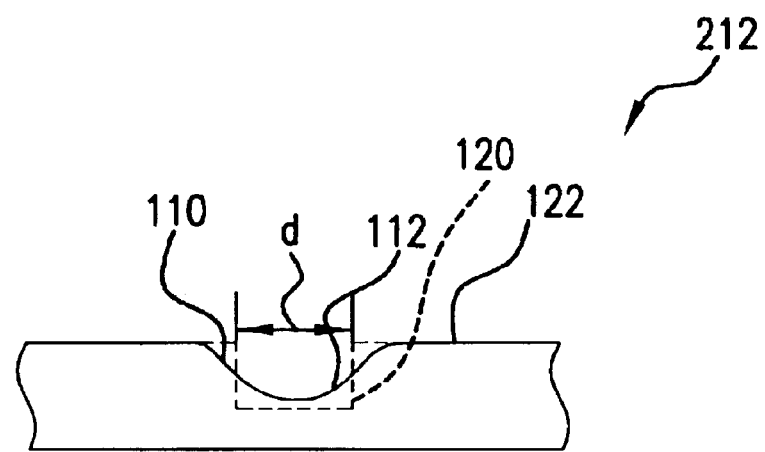
FIG. 26 is a cross-sectional view illustrating a mass transport process for making mirror structures for carrying out the present invention.

FIG. 26 illustrates the mass transport operation. Initially, a cylindrical blind hole or inverted mesa 120 is etched into the substrate 122. This hole is produced by reactive ion etching (RIE), in one example. The etched substrate 122 is then exposed to elevated temperature and possibly a controlled atmosphere to initiate the mass transport process thereby yielding a mirror with a positive curvature region 112 that smoothly transitions to a negative curvature region 110.

Such mirror profiles are alternatively produced with a direct etching process such as by reflowing a deposited resist followed by a non or partially selective etch process.

Figure 27A:
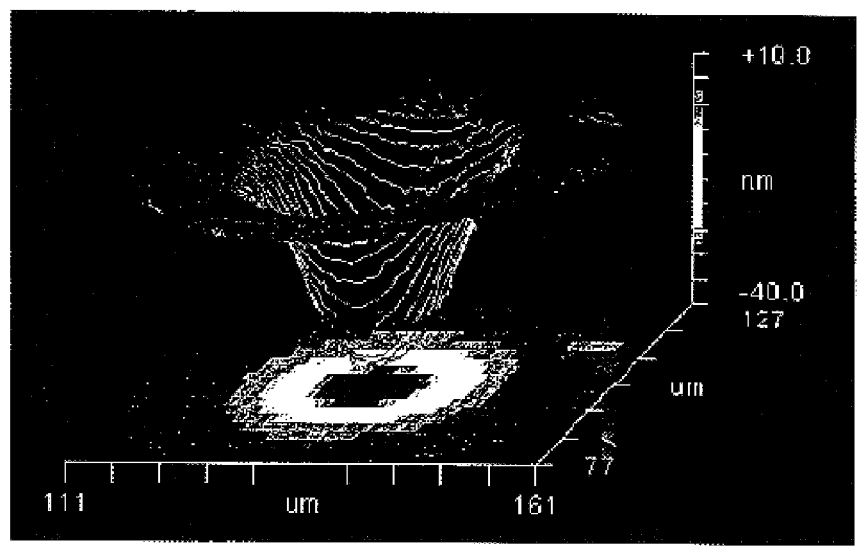
FIG. 27A is a three-dimensional plot showing the measured profile of a mirror fabricated using a mass transport process from a 12 µm mesa precursor structure.
Figure 27B:
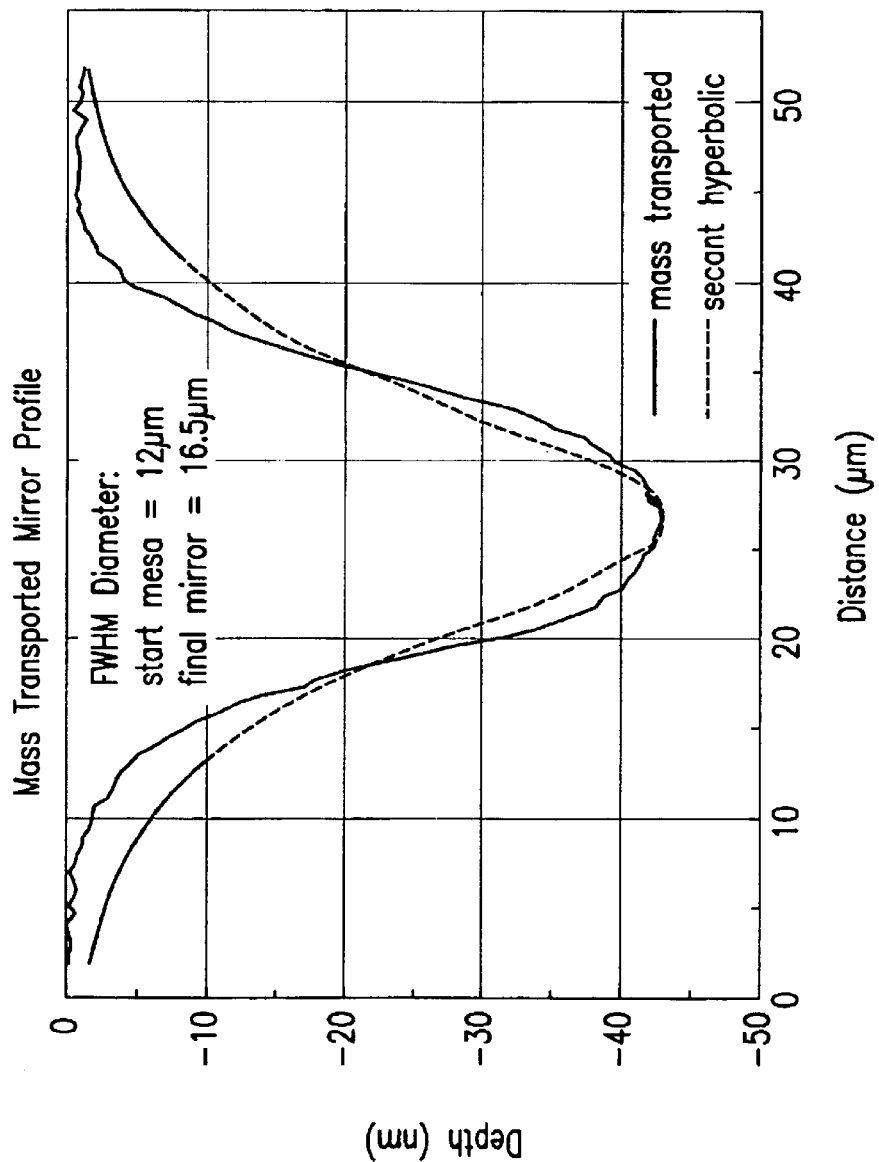
FIG. 27B is a cross-sectional view showing a measured mirror profile for a mass transported 12 µm mesa precursor structure.

FIGS. 27A and 27B are profile plots of an exemplary 12 micrometer mesa after mass transport, which plots are based on actually metrology data. After mass transport, the mirror diameter, full width at half max, is slightly larger than the starting mesa diameter. As the starting mesa diameters get smaller, the final transported mirror depth or sag also gets slightly smaller. The initial mesa diameters varied between 30 and 12 $\mu$m; correspondingly, the final transported mesa diameters, full width at half maximum, varied between 31 and 17 $\mu$m and the final mirror sags varied between 80 and 50 nm. For comparison, FIG. 27B also shows calculated secant hyperbolic mirror profile with the same full width half max as the fabricated mass-transported mirror.

Figure 28:
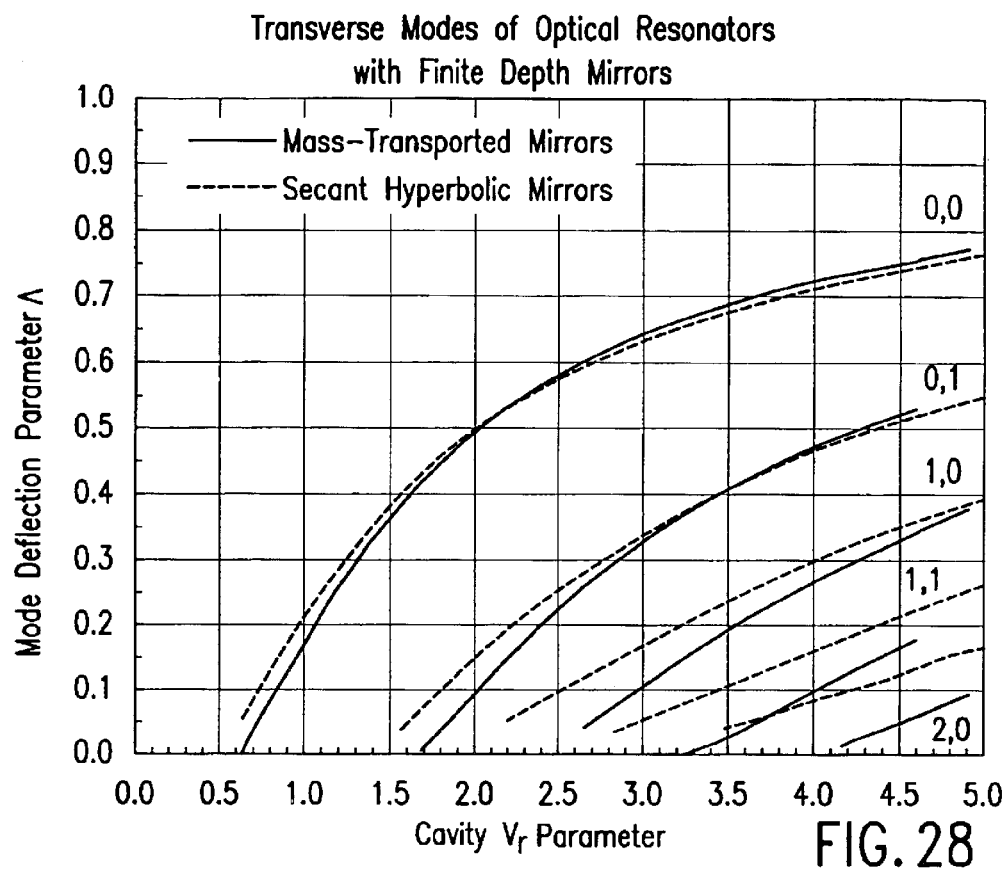
FIG. 28 is the Λ-V transverse mode stability diagram comparing optical resonators using mirrors with secant hyperbolic and mass-transported surface profiles.

FIG. 28 shows the calculated $\Lambda$-V diagram for the resonators using the mass-transported and the secant hyperbolic mirror profiles. The $\Lambda$-V curves for the two mirror profiles are very similar for the fundamental and the lowest order modes, which is the region of most interest, typically. The curves for the two profiles increasingly differ for higher order transverse modes. More generally, FIG. 28 illustrates that the inventive modal operating principles, as well as the inventive single transverse mode operation, apply to resonators with a variety of mirror profiles and are not restricted to the secant hyperbolic shaped mirrors.

Figure 29A:
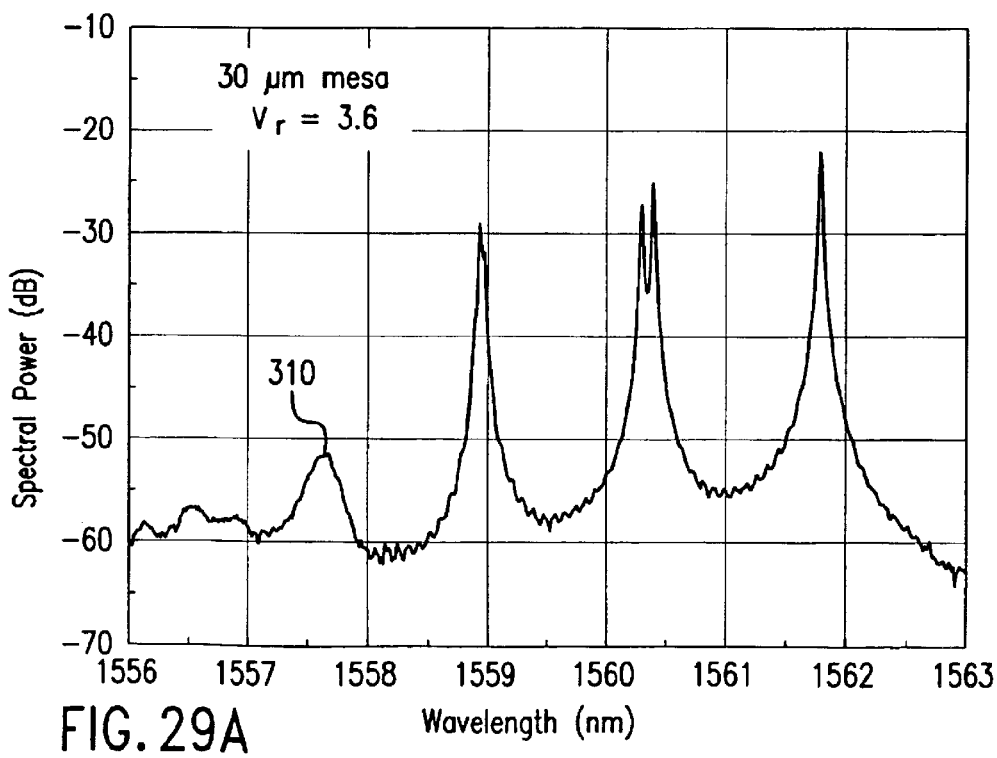
FIG. 29A is a plot of measured spectral power in decibels (dB) as a function of wavelength in nanometers (nm) illustrating the transmission spectrum of a Fabry-Perot filter configured according to the present invention, where the resonator V parameter is $V_r$=3.6.
Figure 29B:
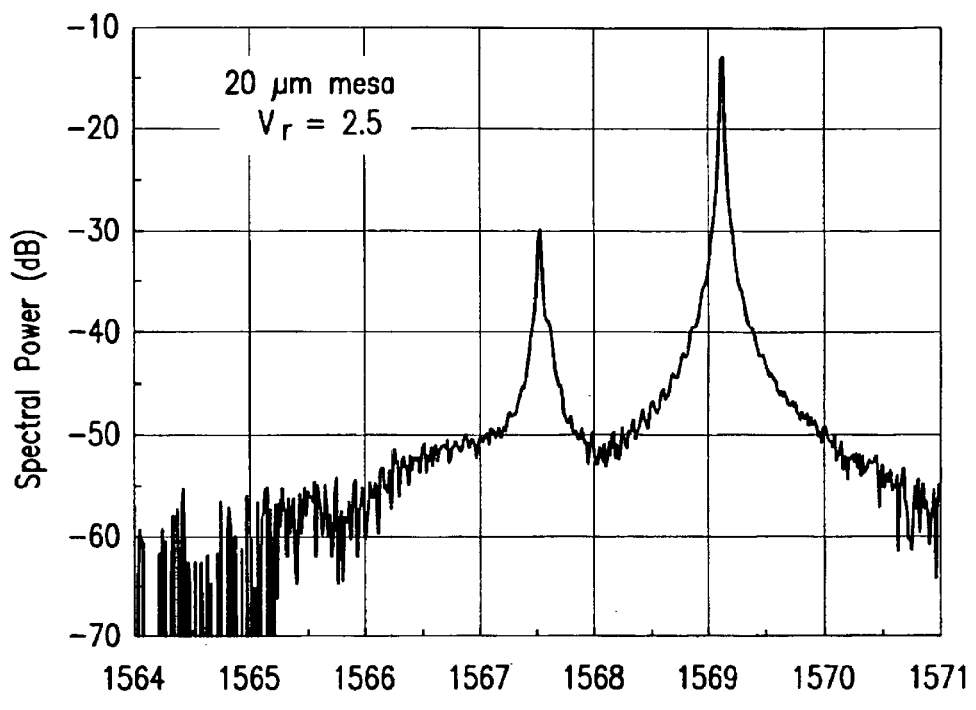
FIG. 29B is a plot of measured spectral power in decibels (dB) as a function of wavelength in nanometers (nm) illustrating the transmission spectrum of a Fabry-Perot filter configured according to the present invention, where the resonator V parameter is $V_r$=2.5.
Figure 29C:
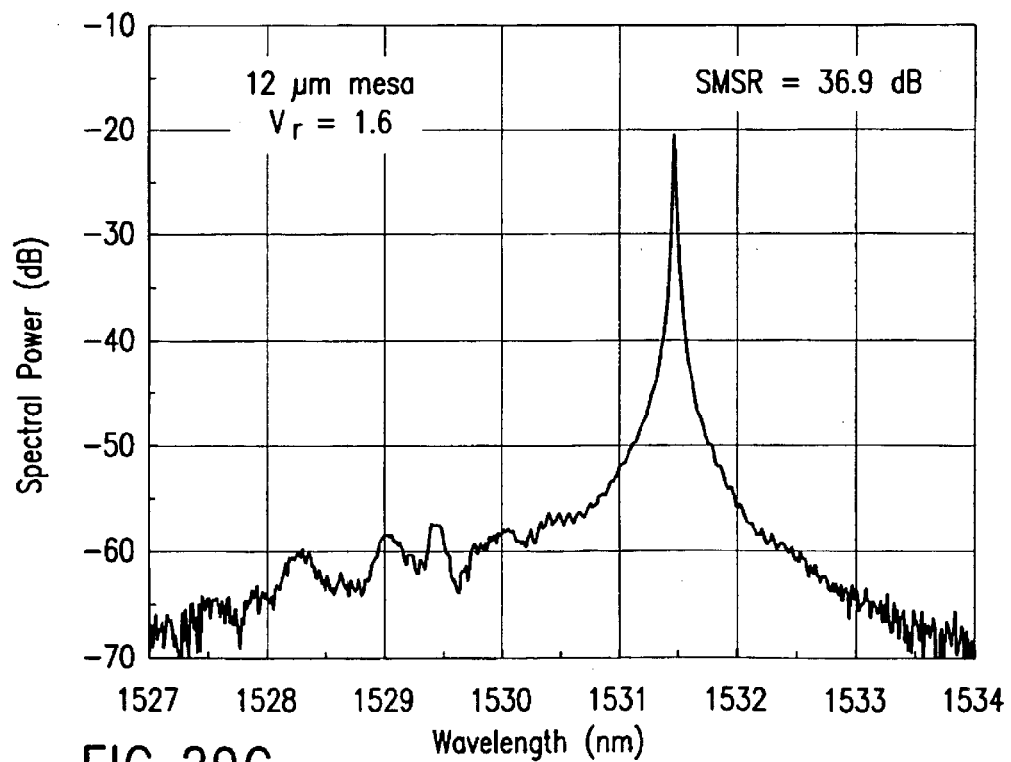
FIG. 29C is a plot of measured spectral power in decibels (dB) as a function of wavelength in nanometers (nm) illustrating the transmission spectrum of a Fabry-Perot filter configured according to the present invention, where the resonator V parameter is $V_r$=1.6 and the resonator operates essentially with a single transverse mode.

FIGS. 29A, 29B, and 29C show the measured spectra of the optical resonators constructed using the mass-transported GaP mirrors paired with flat mirrors in 23 $\mu$m long cavities.

For the wider mirror, shown in FIG. 29A, with mesa diameter of 30 $\mu$m and $V_r$=3.6, the resonator supports three stable transverse modes; the fourth mode 310 is approaching cutoff and has a broad spectral line corresponding to low mode finesse.

For the narrower mirror, shown in FIG. 29B, with mesa diameter of 20 $\mu$m and $V_r$=2.5, the resonator supports only two stable transverse modes.

For the narrowest tested mirror, shown in FIG. 29C, with mesa diameter of 12 $\mu$m and $V_r$=1.6, the resonator supports only one stable transverse mode, with the first higher order mode just at the cutoff condition. These modal spectra and modal stabilities are in agreement with the $\Lambda$-V mode stability diagram in FIG. 28.

Generally, the remaining stable higher order modes can be preferentially excited through input beam misalignment and through mode field size mismatching. This has been used to measure the finesse, and thus the intracavity loss, of the individual resonator transverse modes.

Figure 30:
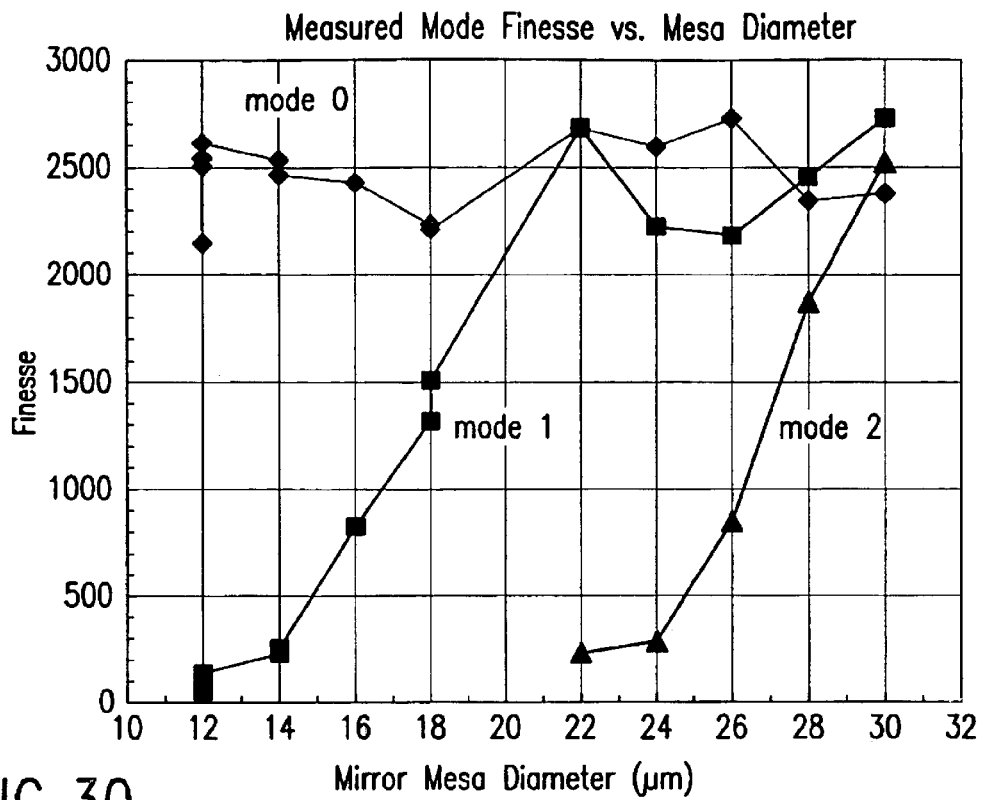
FIG. 30 is a plot of measured transverse mode finesse as a function of pre-transport mesa diameter illustrating the mode discrimination of Fabry-Perot resonators configured according to the present invention.

FIG. 30 is a plot of the measured transverse mode finesse as a function of the starting mesa, i.e., prior to mass transport, diameter, although the data represents resonant cavities made using post transport mirrors. The cavity length was approximately 23 $\mu$m for all filters. The lowest order, i.e., fundamental, transverse mode (mode 0) exhibits a stable finesse of approximately 2,500 without regard to the mesa diameter. A second order mode (mode 2) finesse, in contrast, starts deteriorating at an approximately 30 micrometer mesa diameter and becomes fully degraded at approximately 24 micrometers. Similarly, the first order mode (mode 1) finesse starts exhibiting deterioration at a mesa diameter of 21 micrometers and is completely degraded at about a 12 to 14 micrometer mesa diameter.

Figure 31:
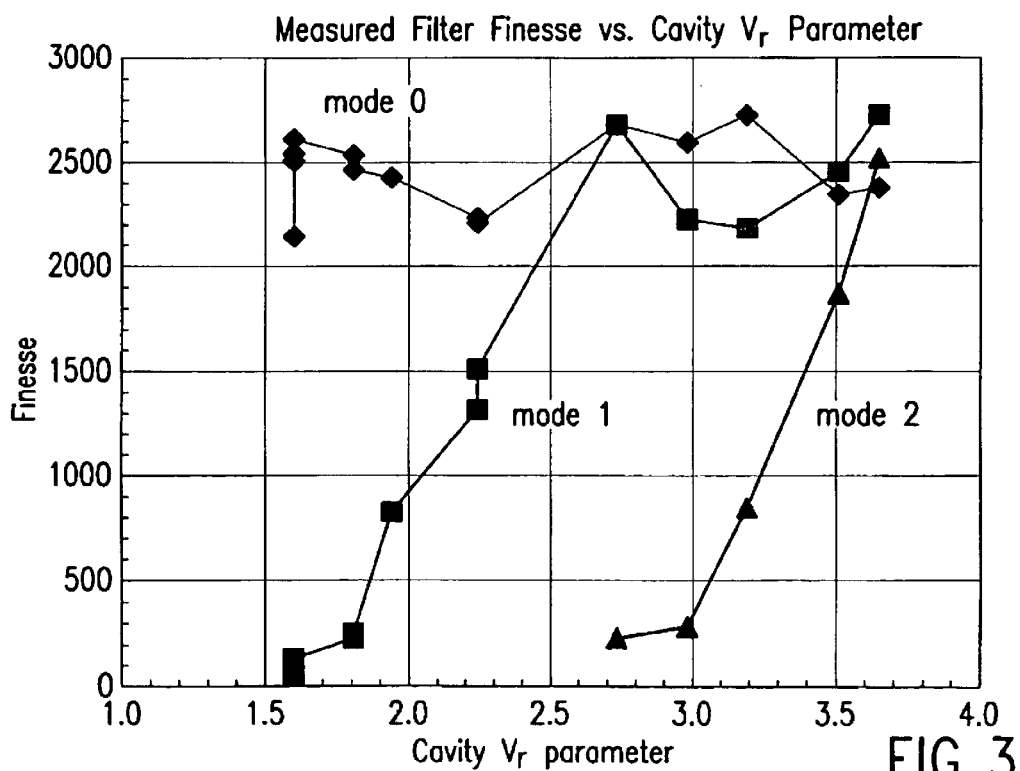
FIG. 31 is a plot of measured transverse mode finesse as a function of the resonator V parameter illustrating the mode discrimination of Fabry-Perot resonators configured according to the present invention.

FIG. 31 is a plot of the measured mode finesse as a function of the resonator V parameter. This plot generally illustrates that cavities with V parameters below 3.5 generally exhibit improved mode control in which the number of modes is limited to 3 or less. V parameters below 2.5 begin to exhibit single mode or near single mode operation, with a V parameter of less than about 1.7 typically resulting in single mode operation.

More specifically, mode 2 finesse degrades and the mode disappears near $V_r$~2.7, which agrees well with the mode (1,0) cutoff near $V_r$~2.6 for mass-transported mirrors in FIG. 28. Mode 1 in FIG. 31 degrades finesse and disappears near $V_r$~1.6, in agreement with the mode (0,1) cutoff near $V_r$~1.7 for mass-transported mirrors in FIG. 28.

These experimental measurements confirm the modal analysis of the optical resonators. FIG. 25 superimposes our experimental results on top of the theoretical stability diagram: the two circles connected by a dashed line indicate the range of experimental mirror filters with starting mesa diameters from 22 to 12 $\mu$m that showed the transition from low loss first higher order mode (mode 1) to highest loss for this mode. Thus, this dashed line with two end points indicates the measured transition from two mode to single mode operation; this line approaches the theoretical single mode regime boundary for these filters with a 23 $\mu$m long cavity.

Mode finesse degradation as the mode approaches cutoff, which is observed in FIGS. 30 and 31, likely occurs because of the large spatial spread of the loosely bound modes near modal cutoff. Such widely spread modes are more sensitive to mirror and cavity imperfections which can induce loss. For example, angular misalignment of the finite deflection mirror and the essentially flat mirror causes diffraction loss and reduced finesse, with a much larger effect on the loosely bound modes near cutoff. This mirror tilt loss of the resonators is analogous to the bend radiation loss in optical waveguides, which is also much stronger for weakly guided modes. Angular misalignment in spherical mirror resonators causes only a lateral shift of the mode and a tilt of the optic axis. Tilt misalignment in finite deflection mirror resonators also causes a mode shift inside the mirror, but the small diameter mirrors can tolerate only a small mode shift and thus only small mirror tilts.

When the inventive optical resonator is constructed such that the first higher order is not fully cutoff, the achievable side mode suppression ratio, the SMSR, is still better than for conventional spherical mirror resonators. In addition, the SMSR for inventive resonators is more tolerant of lateral misalignment of the resonator input excitation beam.

Figure 32A:
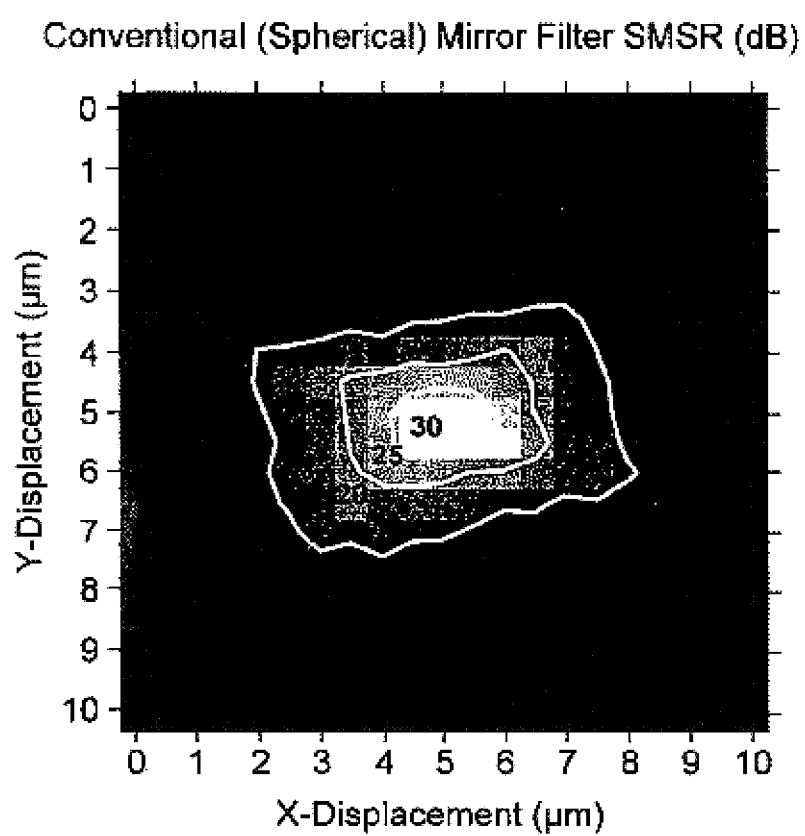
FIG. 32A is an image and contour plot of the measured Fabry-Perot filter side mode suppression ratio for the conventional spherical mirror resonator, illustrating filter SMSR sensitivity to the lateral x-y displacements of the filter input beam.
Figure 32B:
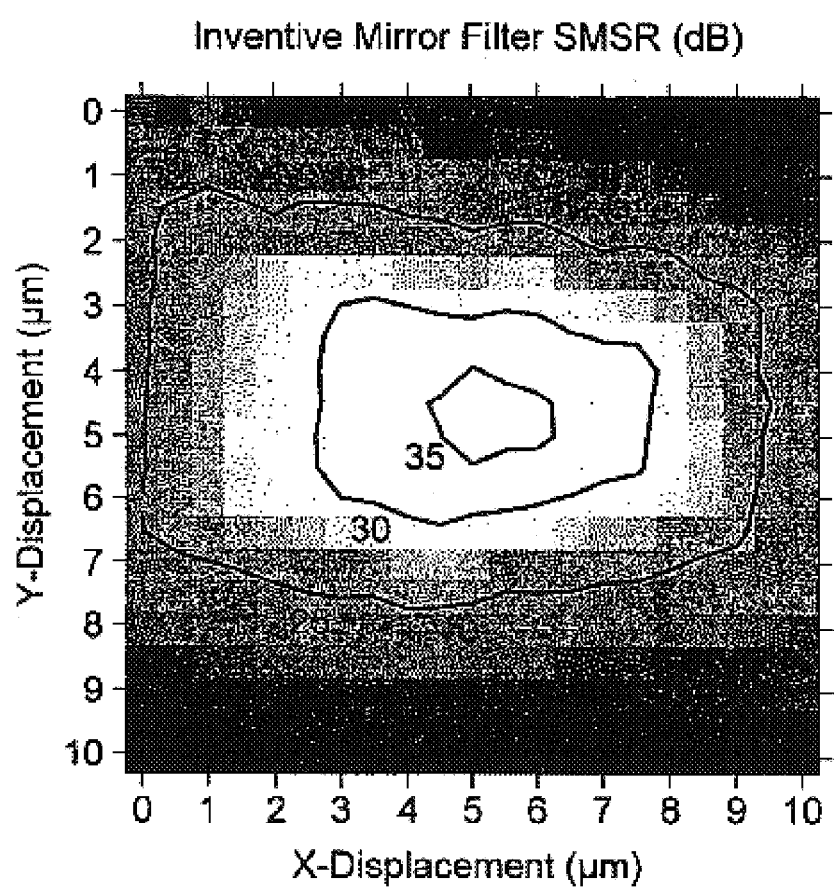
FIG. 32B is an image and contour plot of the measured Fabry-Perot filter side mode suppression ratio for the inventive resonator with mass-transported mirrors, illustrating much lower filter SMSR sensitivity to the lateral x-y displacements of the filter input beam.

FIGS. 32A and 32B show the measured contour plots of the optical filter SMSR for the conventional hemispheric tunable resonator, FIG. 32A, and the inventive tunable resonator, FIG. 32B, as functions of the lateral x and y displacement of the input beam in micrometers. Here the cavity length is ~16 $\mu$m and the inventive mass transported mirror resonator has a V number of V=1.9 (FIG. 32B). The inventive resonator achieves a finesse of ~37 dB as compared with a finesse of ~31 dB for the spherical mirror resonator. Also, to keep the SMSR above 25 dB, the spherical mirror resonator can tolerate input beam x-y displacements of only 1.0 $\mu$m, or +/−0.5 $\mu$m; in contrast, for the same SMSR range the inventive resonator can tolerate displacements of 6 $\mu$m, or +/−3 $\mu$m. This implies relaxed assembly tolerances for the inventive optical filters.

Exemplary Tunable Fabry-Perot MOEMS Filter Implementation

One embodiment of the present invention is as a tunable Fabry-Perot filter.

In some implementations, the filter is fabricated by shaping the ends of a solid material with the desired mirror curvatures and then HR coating the ends. In such case, the net mirror curvature can be distributed between both mirrors. The optical distance between the ends is adjusted mechanically or thermally, for example.

In an other implementation, the flat first mirror structure 210 and/or the inflection mirror structure 212 is deflectable or movable in a Z-axis direction using MOEMS technology, for example, to thereby provide for a tunable filter with a tunable pass band.

Generally, the mode field diameter for the lowest order mode as defined by the intensity $1/e^2$ diameter of the mode 214, generally fits within the central portion of the mirror (see FIG. 19). Typically, the ratio of the mode field $1/e^2$ diameter to the diameter w of the mirror FWHM is slightly greater than about 0.5, usually greater than 0.7. For fully single mode resonators, the ratio is typically greater than about 0.9 to greater than 1.2, or more.

In contrast, the mode field diameter of a higher order mode, when stable, extends into the negative curvature portion 110, and possibly the flat portions 111 surrounding the regions with the optical curvature. This eventually makes the cavity unstable for that mode. In this way, the invention utilizes phase profiling or a phase aperture. A variation in phase is introduced across transverse plane to preferentially preserve the lowest order mode while making the higher order modes unstable.

Figure 33:
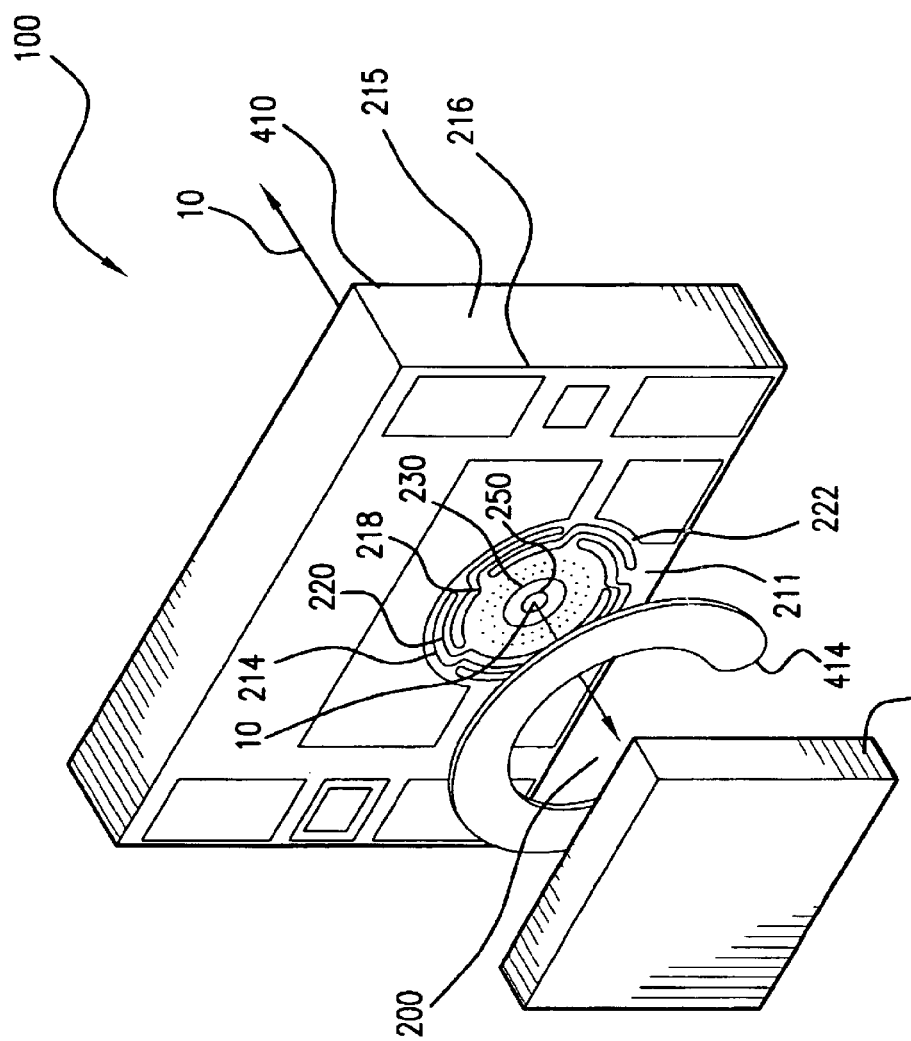
FIG. 33 is a perspective view of a MOEMS Fabry-Perot filter to which the present invention is applied.

FIG. 33 shows an exploded, exemplary micro-opto-electro-mechanical system (MOEMS) Fabry-Perot tunable filter 100 having a resonant cavity 200 that is constructed according to the principles of the present invention.

Generally, in the FP filter 100, a spacer device 414 separates the mirror device 412 from the membrane device 410 to thereby define the Fabry-Perot (FP) cavity 200.

The optical membrane device 410 comprises handle material 215 that functions as a support. An optical membrane or device layer 211 is added to the support material 215. The membrane structure 214 is formed in this optical membrane layer 211. An insulating layer 216 separates the optical membrane layer 211 from the support material 215. During manufacture, this insulating layer 216 functions as a sacrificial/release layer, which is partially removed to release the membrane structure 214 from the support material 215. This insulating layer defines the electrostatic cavity between the membrane structure 214 and the handle wafer in the illustrated implementation. Electrical fields are established across this cavity to provide the forces necessary to deflect the membrane out-of-plane and therefore tune the filter 100 by modulating the size of the cavity 200.

In the current implementation, the membrane structure 214 comprises a body portion 218. The optical axis 10 of the device 100 passes concentrically through this body portion 218 and orthogonal to a plane defined by the membrane layer 211. A diameter of this body portion 218 is preferably 300 to 600 micrometers; currently it is about 500 micrometers.

Tethers 220 extend radially from the body portion 218 to an outer portion 222, which comprises the ring where the tethers 220 terminate. In the current implementation, a spiral tether pattern is used.

An optical coating dot 230 is typically deposited on the body portion 218 of the membrane structure 214. A second optical coating is deposited on the mirror device 412 to thereby define the other end of the FP cavity. The optical coatings are preferably a highly reflecting (HR) dielectric mirror stacks, comprising 6 or more layers of alternating high and low index material. This yields a highly reflecting, but low absorption, structure that is desirable in, for example, the manufacture of high finesse Fabry-Perot filters.

According to the invention, the curved-flat resonator incorporating the principles of the present invention is used in the filter 100. Specifically, in one embodiment, one end of the resonator 200 is defined by a substantially flat mirror structure 210. The second mirror structure 212 has a profile that provides the spatial mode selectivity of the present invention.

Depending on the FP filter implementation, either the mirror device 412 or center region 250 of the membrane 214 is patterned to have the second mirror structure's mode selective profile, with the other end of the cavity 200 being defined by the relatively flat mirror structure 210. That is, in one implementation, the flat first reflector 210 is on the mirror device 412 with the second mirror structure 212 being etched or otherwise formed in region 250. In the other implementation, the flat first reflector 210 is on the membrane 214, with the mirror device 412 having the second mirror structure 212.

Figure 34:
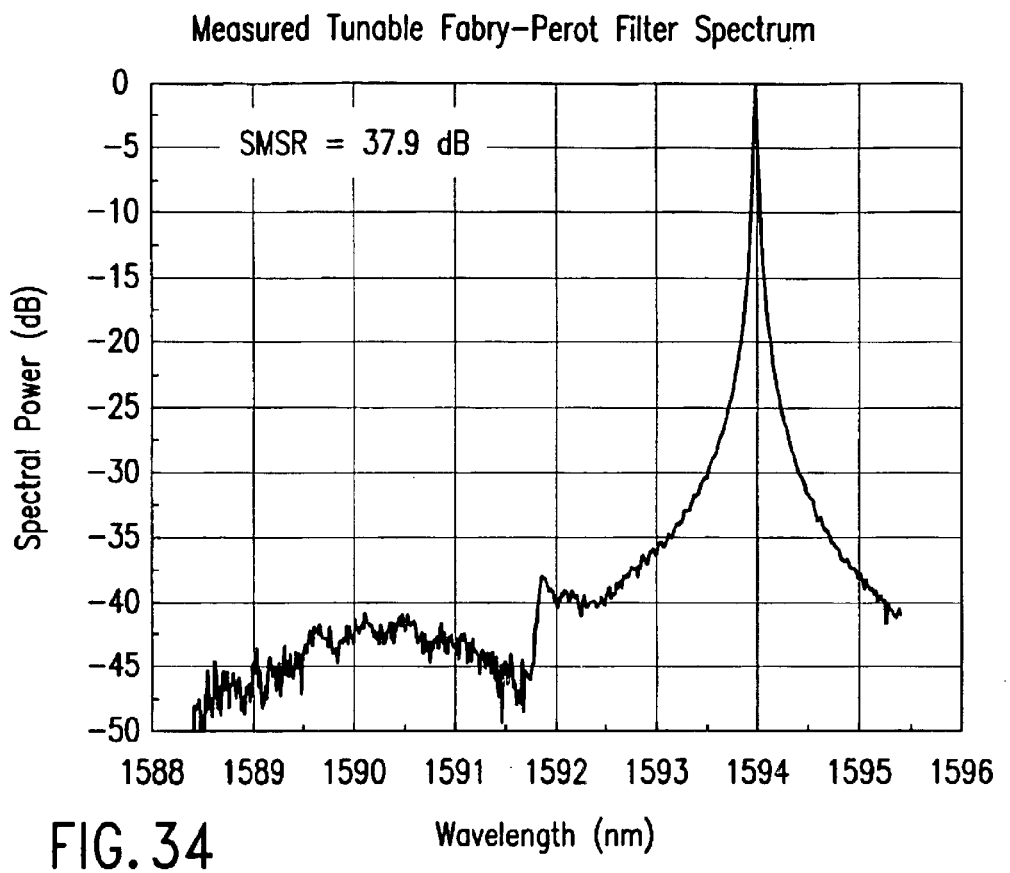
FIG. 34 is a plot of spectral power in decibels (dB) as a function of wavelength in nanometers (nm) illustrating the transmission spectrum of a MOEMS Fabry-Perot tunable filter configured according to the present invention.

FIG. 34 is a plot of spectral power in decibels as a function of wavelength illustrating the filter spectrum for the tunable filter of FIG. 33. The plot shows a well defined fundamental mode; only one higher order mode is observable, it is suppressed to ~38 dB below the fundamental mode.

Parasitic Modes In Fabry-Perot MOEMS Tunable Filters

Figure 35:
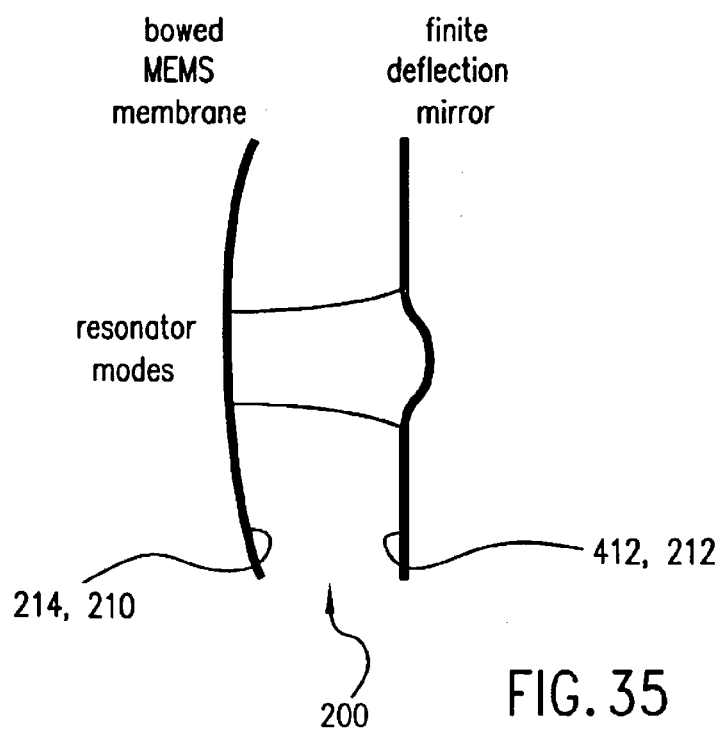
FIG. 35 is a schematic view of curved-flat resonator, according to the present invention, illustrating the parasitic modes that are created by membrane bow.

FIG. 35 is a schematic diagram illustrating an implementation issue sometimes associated with deploying the present invention in a tunable MOEMS-type device, where controlled deflection of a movable membrane mirror, for example, is used to tune the Fabry-Perot resonator. Thin membranes become bowed due to stress in the deposited dielectric reflective mirror coating, for example. The resulting bow affects the transverse mode structure of the resonator.

Specifically, as a result of the bow in a previously flat membrane mirror 210, 214, previously unstable transverse modes of the resonator can become stable and the resonator can acquire new stable parasitic modes, as compared with the case where the membrane mirror is unbowed, or substantially flat. Similar results arise when the curved finite deflection mirror is on the movable membrane or the fixed mirror side of the resonator.

Observing FIG. 35, we see that both mirrors 210, 212 now can have some curvature. We can consider the effect of the two mirrors on the optical mode as one net effective mirror profile that the optical wave sees on one roundtrip in the cavity; the second effective mirror of the effective cavity is then flat.

Figure 36A:
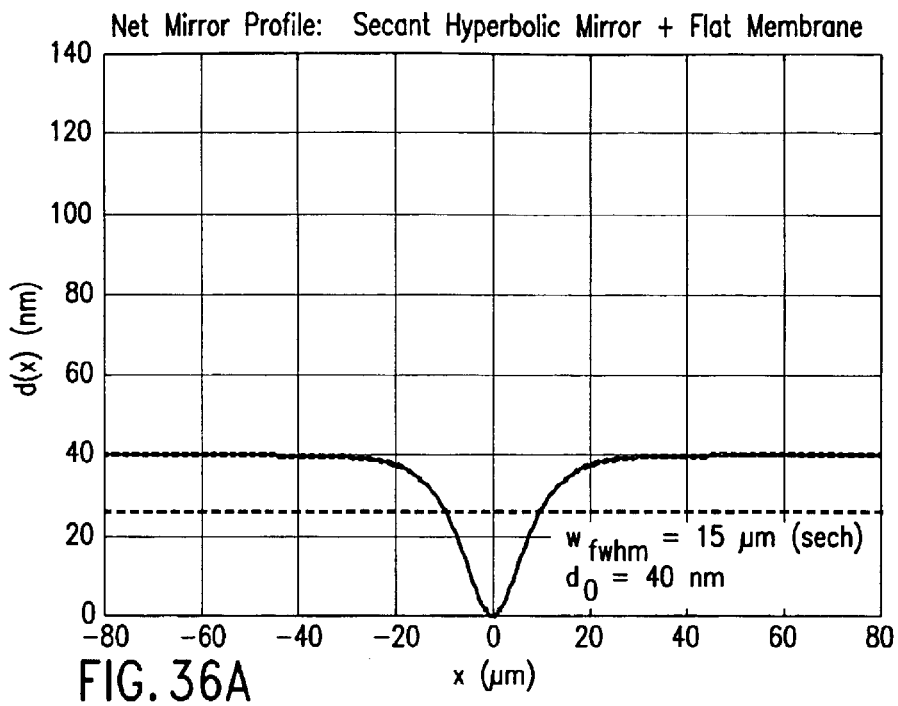
FIG. 36A shows the net effective mirror profile and the effective single mode deflection for an optical cavity with a secant-hyperbolic-shape finite deflection mirror paired with a flat membrane second mirror.

FIG. 36A shows the net mirror profile and the effective mode deflection for a 20 μm long cavity where the finite deflection mirror has a secant hyperbolic shape and the membrane is flat. The secant hyperbolic mirror has a sag of $d_0$=40 nm and a full width half max diameter of w=15 μm. The cavity has a single stable transverse mode.

Figure 36B:
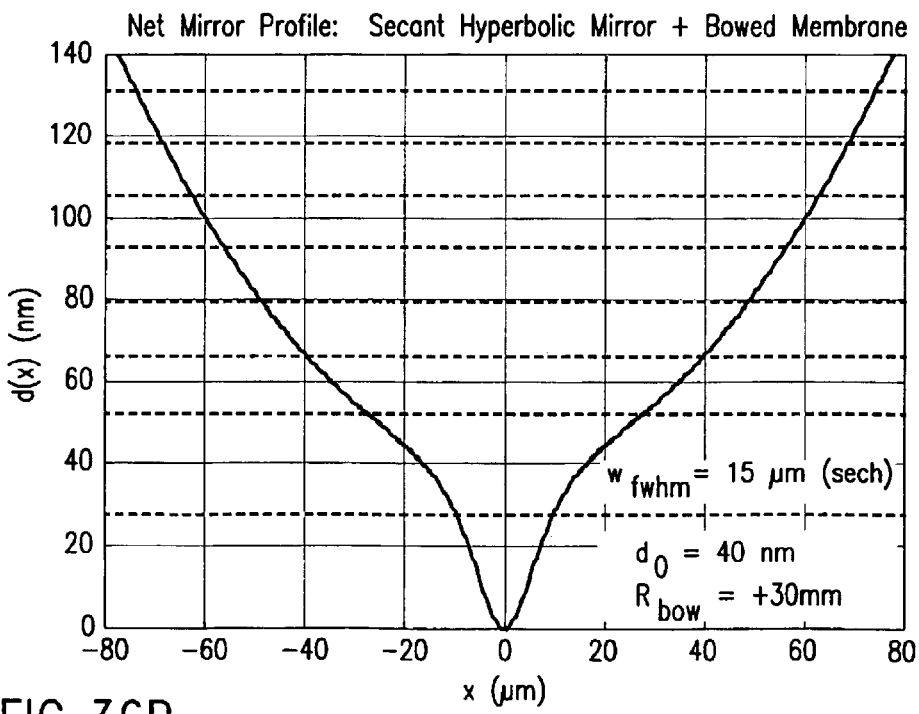
FIG. 36B shows the net effective mirror profile and the effective multiple mode deflections for an optical cavity with a secant-hyperbolic-shape finite deflection mirror paired with a positively-bowed-membrane second mirror, illustrating parasitic modes of the cavity.

FIG. 36B shows the net mirror profile and the effective modal deflections of the same secant hyperbolic shape mirror paired in a cavity with a positively bowed membrane. We assume the membrane bow is approximately spherical. The membrane radius of curvature is $R_{mems}$=30 mm, while the center of the secant hyperbolic mirror has a radius of curvature of $R_{sec\,h}$=0.81 mm. The net mirror profile now has effectively unbounded deflection, with the resulting multitude of stable transverse modes. Just the radial modes are shown here in which $n_{azim}$=0. The fundamental mode is due to the secant hyperbolic mirror, while the higher order modes are similar to the modes of the conventional flat-spherical mirror cavity formed by the spherically bowed membrane and the flat annular regions outside the center of the secant hyperbolic mirror. These higher order modes have the smaller mode and effective displacement spacing approximately corresponding to this parasitic flat-spherical cavity with a large spherical radius of curvature. These higher order modes can also have the larger mode diameters associated with the large radius of curvature of the parasitic cavity, as compared with the smaller mode diameter of the fundamental mode of the secant hyperbolic mirror cavity.

Figure 36C:
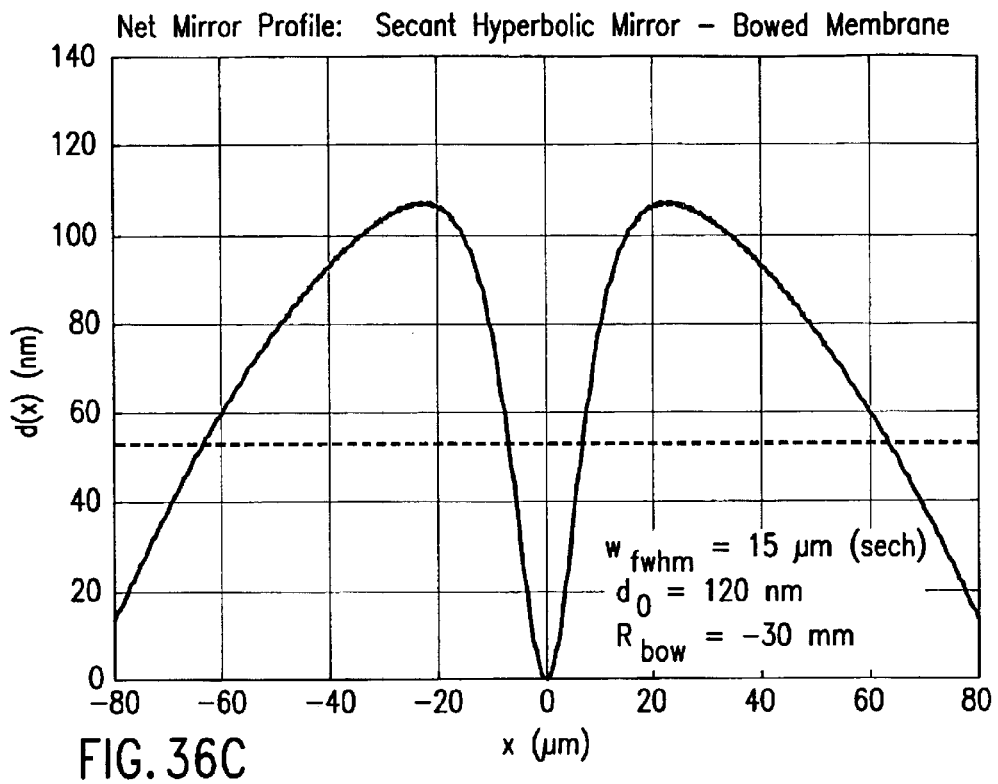
FIG. 36C shows the net effective mirror profile and the effective single mode deflection for an optical cavity with a deeper sag secant-hyperbolic-shape finite deflection mirror paired with a negatively-bowed-membrane second mirror.

FIG. 36C shows the net mirror profile and the effective modal deflection of a secant hyperbolic mirror paired with a negatively bowed membrane. Here the secant hyperbolic mirror has the same diameter as before, namely w=15 $\mu$m, but a bigger sag, $d_0$=120 nm. In this case of a negative bow only a single stable transverse mode is observed, but a bigger secant hyperbolic mirror sag was required to achieve the desired single mode operation.

Figure 37:
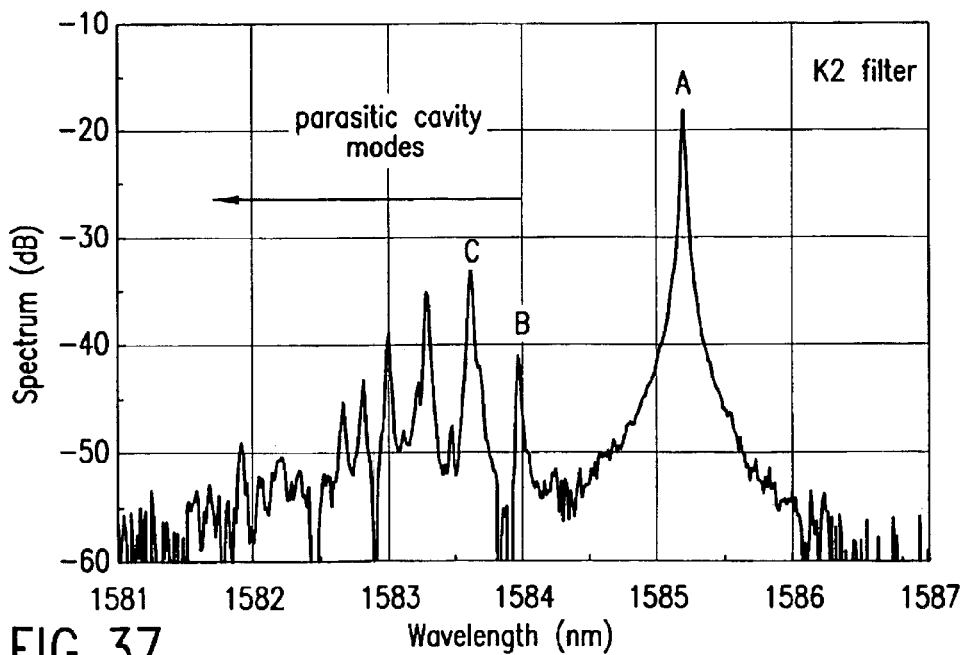
FIG. 37 is a plot of spectral power in decibels (dB) as a function of wavelength in nanometers (nm) illustrating the transmission spectrum of a MOEMS Fabry-Perot filter with a mass-transported inventive mirror when parasitic modes due to positive membrane bow are present.

FIG. 37 shows the measured transmission spectrum of a MOEMS Fabry-Perot filter with a mass-transported inventive mirror when parasitic modes due to membrane bow are present. There is a well-defined fundamental mode, labeled A, due to the mass-transported curved mirror. We also observe at shorter wavelengths a set of parasitic modes, labeled B, C that correspond to the parasitic cavity due to the membrane bow. The parasitic mode spacing is consistent with the membrane bow radius of curvature of approximately 30–60 mm. Observations of filter mode profiles with an infrared camera show much larger parasitic mode diameters, of the order of 50 $\mu$m, as compared with the approximately 17 $\mu$m diameter of the fundamental mode. These mode profile, as well as spectral spacing, observations confirm that the observed higher order modes are indeed due to the parasitic cavity formed by the bowed down membrane and the flat regions the curved mirror structure.

These parasitic modes due to membrane bow are also addressed using other techniques. For example, options include: 1) HR coating stress control to induce a relatively flat or negatively bowed membrane; 2) fabricate an additional negative curvature section in the annular region 111 outside the center of the curved mirror; 3) remove HR coating in the annular region 111 or on the opposed portions of the membrane 210 to suppress the finesse of the parasitic modes; 4) induce loss in the annular region 111 or the opposed portions of membrane 210 via surface roughening, surface blackening, for example, again in order to suppress the finesse of the parasitic modes; 5) laterally shift the curved mirror relative to the bowed membrane, such that the parasitic modes are centered away from the curved mirror center, and are thus more weakly excited and more easily suppressed.

While this invention has been particularly shown and described with references to preferred embodiments thereof, it will be understood by those skilled in the art that various changes in form and details may be made therein without departing from the scope of the invention encompassed by the appended claims.

What is claimed is:

1. An optical resonator comprising at least one optical cavity defined by at least two mirror structures in which $$V_r \equiv \frac{\pi w}{\lambda} \bar{n} \sqrt{d_0/L_c}$$

is less than about 3.5; where $d_0$ is a sag of a net mirror profile of the mirror structures and w is a full width at half maximum (FWHM) diameter of the net mirror profile of the mirror structures, $\bar{n}$ is the refractive index of the optical cavity; $\lambda$ is the wavelength of operation, and $L_c$ is a length of the optical cavity.

2. A resonator as claimed in claim 1, wherein $V_r$ is less than 2.8.

3. A resonator as claimed in claim 1, wherein $V_r$ is less than 1.5.

4. A resonator as claimed in claim 1, wherein in an optical distance between the mirror structures is tunable.

5. A resonator as claimed in claim 1, wherein an optical distance between the mirror structures is tunable by out-of-plane deflection of one of the mirror structures.

6. A resonator as claimed in claim 1, wherein a first one the mirror structures is relatively flat such that $d_0$ and w are based on the mirror profile of the second mirror structure.

7. An optical resonator having an optical cavity defined by a first mirror structure comprising a substantially flat surface on which a first dielectric mirror is deposited and a second mirror structure comprising a curved surface on which a second dielectric mirror is deposited, wherein a ratio of the mode $1/e^2$ intensity of a lowest order mode to the full width at half maximum (FWHM) diameter of the curved surface of the second mirror structure is greater than 0.7.

8. A resonator as claimed in claim 7, wherein the ratio is greater than about 1.

9. A resonator as claimed in claim 7, wherein the ratio is greater than about 1.2.

10. A resonator as claimed in claim 7, wherein in an optical distance between the mirror structures is tunable.

11. A resonator as claimed in claim 7, wherein at least one of the mirror structures is formed on an electrostatically deflectable structure.

12. An optical resonator comprising at least one optical cavity defined by at least two mirror structures in which $$3.5 > \frac{\pi w}{\lambda} \bar{n} \sqrt{d_0/L_c};$$

where $d_0$ is a sag of a net mirror profile of the mirror structures and w is a full width at half maximum (FWHM) diameter of the net mirror profile of the mirror structures, $\bar{n}$ is the refractive index of the optical cavity; $\lambda$ is the wavelength of operation, and $L_c$ is a length of the optical cavity.

* * * * *